US012630921B2

(12) United States Patent
Oh et al.

(10) Patent No.: US 12,630,921 B2
(45) Date of Patent: May 19, 2026

(54) POWDER-SURFACE TREATMENT APPARATUS

(71) Applicants: Hyundai Motor Company, Seoul (KR); Kia Corporation, Seoul (KR); ISAC RESEARCH INC., Daejeon (KR)

(72) Inventors: Seung Jeong Oh, Hwaseong-si (KR); Woong Pyo Hong, Suwon-si (KR); Jung Yeon Park, Hwaseong-si (KR); Chae Woong Kim, Daejeon (KR); Hyung Sang Park, Seoul (KR)

(73) Assignees: Hyundai Motor Company, Seoul (KR); Kia Corporation, Seoul (KR); ISAC Research Inc., Daejeon (KR)

( * ) Notice: Subject to any disclaimer, the term of this patent is extended or adjusted under 35 U.S.C. 154(b) by 811 days.

(21) Appl. No.: 18/148,331

(22) Filed: Dec. 29, 2022

(65) Prior Publication Data

US 2024/0018649 A1 Jan. 18, 2024

(30) Foreign Application Priority Data

Jul. 13, 2022 (KR) ........................ 10-2022-0086398

(51) Int. Cl.
*C23C 16/44* (2006.01)
*C23C 16/455* (2006.01)

(52) U.S. Cl.
CPC .... *C23C 16/4417* (2013.01); *C23C 16/45544* (2013.01)

(58) Field of Classification Search
CPC ........................ C23C 16/4417; C23C 16/4583
See application file for complete search history.

(56) References Cited

U.S. PATENT DOCUMENTS

| | | | | | |
|---|---|---|---|---|---|
| 5,683,561 A | * | 11/1997 | Hollars | ................. | C23C 14/568 |
| | | | | | 204/298.25 |
| 6,688,375 B1 | * | 2/2004 | Turner | ................... | C23C 16/46 |
| | | | | | 414/217 |
| 8,137,464 B2 | | 3/2012 | Dickey et al. | | |

(Continued)

FOREIGN PATENT DOCUMENTS

| | | | |
|---|---|---|---|
| KR | 101535354 B | 7/2015 | |
| KR | 101550500 B | 9/2015 | |

(Continued)

*Primary Examiner* — John J Brayton
(74) *Attorney, Agent, or Firm* — Slater Matsil, LLP

(57) ABSTRACT

An embodiment powder-surface treatment apparatus includes a housing defining an internal space, a main chamber installed in the internal space and defining an accommodation space in which a surface treatment process is performable using ALD, an injection unit provided on a first end portion of the main chamber, a plurality of sub-chambers arranged in a stack on top of each other in a multi-step configuration along the accommodation space in the main chamber in a state where an internal space in each of the plurality of sub-chambers is filled with a powder, a discharging unit provided on a second end portion of the main chamber, a loading apparatus configured to load a new sub-chamber into the accommodation space in the main chamber, and an unloading apparatus configured to unload and discharge at least one of the plurality of sub-chambers from the accommodation space to the outside.

20 Claims, 25 Drawing Sheets

(56) References Cited

U.S. PATENT DOCUMENTS

| | | |
|---|---|---|
| 2005/0103264 A1 | 5/2005 | Jansen |
| 2007/0131990 A1* | 6/2007 | Jang .................. H01L 21/67778 |
| | | 257/291 |
| 2019/0071776 A1* | 3/2019 | Boguslavsky ........ C23C 16/402 |
| 2020/0263299 A1* | 8/2020 | Hong ................ C23C 16/45555 |

FOREIGN PATENT DOCUMENTS

| | | |
|---|---|---|
| KR | 20200100928 A | 8/2020 |
| KR | 20200122020 A | 10/2020 |
| KR | 102173461 B | 11/2020 |
| KR | 20210001189 A | 1/2021 |
| WO | 20080057625 A2 | 5/2008 |

* cited by examiner

POWDER-SURFACE TREATMENT APPARATUS

CROSS-REFERENCE TO RELATED APPLICATIONS

This application claims the benefit of Korean Patent Application No. 10-2022-0086398, filed on Jul. 13, 2022, which application is hereby incorporated herein by reference.

TECHNICAL FIELD

The present disclosure relates to a powder-surface treatment apparatus.

BACKGROUND

A technology, such as atomic layer deposition (ALD), may be used in order to coat a surface of a powder with a specific material. FIG. 1 illustrates a powder-surface treatment apparatus in the related art. An atomic layer deposition (hereinafter referred to as an "ALD") process may be performed on a surface of a powder using the powder-surface treatment apparatus.

Specifically, the atomic layer deposition process may be performed using a method in which a material that is to be coated is inserted into a gas deposition chamber (or a reaction chamber) and in which metal precursor gas or the like is introduced into the gas deposition chamber.

In the atomic layer deposition process, a surface of a particle of the material (particularly, the powder) that is to be coated is exposed to the metal precursor gas, and thus a metal precursor may be deposited on the surface of the particle. In addition, a process of removing air, water vapor, and other contaminants, which are unnecessary for deposition, from the gas deposition chamber, as well as the ALD process, may be performed together.

As an example, the ALD technology may be used in manufacturing a fuel cell metal/carbon catalyst (for example, a platinum (Pt)/carbon (C) catalyst). Specifically, a catalyst manufacturing process may be performed using a dry method or a wet method. Particularly, the ALD process using the dry method may shorten the time for manufacturing a catalyst. In addition, unlike the ALD process using the wet method, the ALD process using the dry method is a more environmentally friendly process because no waste water is discharged.

In an ALD apparatus in the related art, a coating process for coating a nanometer (nm)-size powder with various materials is performed at a high temperature of 200 to 300° C. or above. At this point, in a case where the powder at a high temperature is exposed to outside air, the powder is oxidized by oxygen and moisture. Therefore, there is a risk in that the powder does not function properly or in that ignition occurs.

Accordingly, in existing powder coating and surface treatment processes that use ALD, in a state where a chamber is cooled to room temperature after the process, the powder undergoing coating and surface treatment has to be unloaded, and then a new powder has to be loaded.

In this manner, in the existing powder coating process, the process of cooling and re-heating the chamber has to be repeated in order to load and unload the powder after the process is completely performed. Thus, the processing time taken for the entire process can be inevitably increased. This increase in the processing time is a factor in significantly decreasing productivity and process efficiency and increasing manufacturing cost.

Korean Patent Application Publication No. 10-2020-0100928 (Aug. 27, 2020) and Korean Patent No. 10-2173461 (Nov. 3, 2020) may describe information related to the technical field of the present disclosure.

SUMMARY

The present disclosure relates to a powder-surface treatment apparatus. Particular embodiments relate to a surface treatment apparatus that is capable of preventing oxidation of a powder during a process of performing coating processing on a surface of a powder at a high temperature using an atomic layer deposition (ALD) process.

Therefore, an embodiment of the present disclosure which may solve problems in the art provides a powder-surface treatment apparatus that is capable of preventing oxidation of a powder during a process of performing coating processing on a surface of the powder at a high temperature using an ALD process.

Another embodiment of the present disclosure provides a powder-surface treatment apparatus that is capable of omitting a process of cooling and re-heating a chamber in order to load and unload a powder after a process and of successively loading and unloading the powder without cooling the chamber after the process is completely performed. With the powder-surface treatment apparatus, a decrease in process time, an increase in productivity, and an improvement in process efficiency can be achieved.

Embodiments of the present disclosure are not limited to the above-mentioned embodiments. From the following description, an embodiment not mentioned can be clearly understood by a person of ordinary skill in the art to which the present disclosure pertains.

According to an embodiment of the present disclosure, there is provided a powder-surface treatment apparatus including a housing having an internal space of which at least one portion is possibly sealed up, a main chamber installed in the internal space in the housing and having an accommodation space in which a surface treatment process is performed using atomic layer deposition, an injection unit provided on one end portion of the main chamber in such a manner that gas is injected into the accommodation space in the main chamber through the injection unit, a plurality of sub-chambers arranged to be stacked on top of each other in a multi-step configuration along the accommodation space in the main chamber in a state where an internal space in each of the plurality of sub-chambers is filled with a powder, and configured in such a manner that the gas injected in the accommodation space in the main chamber passes through the plurality of sub-chambers, a discharging unit provided on the other end portion of the main chamber in such a manner that the gas passing through the plurality of sub-chambers is discharged from the accommodation space in the main chamber through the discharging unit, a loading apparatus loading a new sub-chamber into the accommodation space in the main chamber, in the sealed-up internal space in the housing that is filled with inert gas, and an unloading apparatus unloading at least one of the plurality of sub-chambers arranged to be stacked on top of each other in the accommodation space in the main chamber, from the accommodation space, and discharging the at least one unloaded sub-chamber to the outside, in the sealed-up internal space in the housing that is filled with inert gas.

Accordingly, with the powder-surface treatment apparatus according to an embodiment of the present disclosure, the oxidation of the powder can be effectively prevented during the process of performing coating processing on the surface of the powder at a high temperature using atomic layer deposition (ALD).

Particularly, the loading and unloading of the powder can be performed in the internal space on the housing that is filled with inert gas, such as nitrogen or argon. Thus, the powder can be prevented from coming into contact with oxygen or moisture in air.

In addition, the pre-loading sub-chamber and the powder inside the pre-loading sub-chamber are pre-heated inside the housing filled with the inert gas. After unloading, the sub-chamber and the powder that undergo the process are forced to be cooled inside the housing. Thus, the temperature stabilization time can be shortened. Moreover, the time delay that may occur due to the cooling can be reduced. Consequently, the heating time and the cooling time can be reduced. The powder undergoing the process is cooled before being exposed to room temperature. Thus, the oxidation of the powder can be effectively prevented.

In addition, according to embodiments of the present disclosure, the process of cooling and re-heating the main chamber in order to load and unload the powder after the process can be omitted. Moreover, the loading and the unloading of the powder are successively performed without cooling the main chamber after the process is completely performed. Thus, the decrease in process time, the increase in productivity, and the improvement in process efficiency can be achieved.

BRIEF DESCRIPTION OF THE DRAWINGS

The above and other features of embodiments of the present disclosure will now be described in detail with reference to certain exemplary examples thereof illustrated in the accompanying drawings which are given hereinbelow by way of illustration only, and thus are not limitative of the present disclosure, and wherein:

FIGS. 8A to 8G are views each illustrating a state where the surface treatment apparatus according to an embodiment of the present disclosure performs an unloading operation;

FIGS. 9A to 9I are views each illustrating a state where the surface treatment apparatus according to an embodiment of the present disclosure performs a loading operation;

DETAILED DESCRIPTION OF ILLUSTRATIVE EMBODIMENTS

Figure 1:
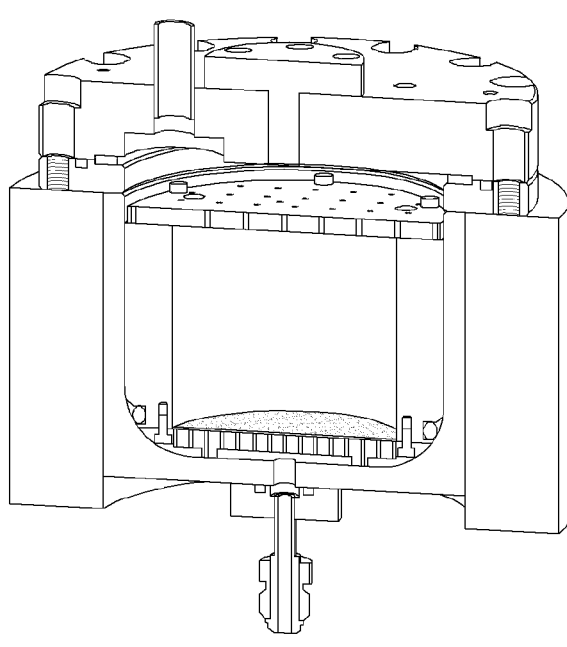
FIG. 1 is a perspective view illustrating a cross section of a powder-surface treatment apparatus in the related art.

Embodiments of the present disclosure will be described in detail below with reference to the accompanying drawings. The embodiments of the present disclosure will be described below only in an exemplary manner in terms of specific structures and functions and, therefore, may be practiced in various forms without departing from the nature and gist of the present disclosure. In addition, the present disclosure should not be construed as being limited to the embodiments described in the specification. All alternatives, equivalents, and substitutes that are included within the scope of the technical idea of the present disclosure should be understood as falling within the scope of the present disclosure.

The terms first, second, and so forth are used to describe various constituent elements in the specification, but without imposing any limitation thereon. Those terms are used only to distinguish one constituent element from another. For example, a first constituent element may be named a second constituent element without departing from the scope of the claims that define the present disclosure. Likewise, the second constituent element may also be named the first constituent element.

It should be understood that a constituent element, when referred to as being "coupled to" or "connected to" a different constituent element, may be directly coupled to or directly connected to the different constituent element or may be coupled to or connected to the different constituent element with an intervening constituent element in between. In contrast, it should be understood that a constituent element, when referred to as being "directly coupled to" or "directly connected to" a different constituent element, is coupled to or connected to the different constituent without any intervening constituent element in between. Expressions such as "between" and "directly between" and expressions such as "adjacent to" and "directly adjacent to" that are used for describing a relationship between constituent elements should be construed in the same manner.

Like reference numerals depict like constituent elements throughout the present specification. The terms used in the present specification are for describing the embodiments and are not intended to impose any limitation on the present disclosure. Unless specially stated otherwise throughout the present specification, a singular noun or a singular noun phrase may have a plural meaning. The terms "comprise" and/or "comprising" used in the specification should be construed to mean "including the following constituent element, step, operation, or element, but not excluding one or more other constituent elements, steps, operations, or elements."

The present applicant filed an application for a patent for a surface treatment apparatus for and a surface treatment method of preventing oxidation of a powder during a process of performing coating treatment on a surface of the powder at a high temperature using an atomic layer deposition (ALD) method (Korean Patent Application Publication No. 10-2020-0100928 (Aug. 27, 2020) titled "Apparatus for surface treating of powder and method of surface treating of powder using the same," which is herein referred to as "Patent Document 1").

Disclosed in Patent Document 1 are an apparatus for surface treating of a powder and a method of surface treating of a powder using the apparatus, the apparatus being configured in such a manner that a plurality of sub-chambers are arranged in an accommodation space in a main chamber and a surface treatment process can be performed in a state where each of the plurality of sub-chambers is filled with a powder.

Embodiments of the present disclosure provide an improvement over the invention in Patent Document 1 on which a patent application was filed by the present applicant and which was published. Embodiments of the present disclosure relate to a surface treatment apparatus and a surface treatment method that are capable of loading and unloading powders successively without cooling a main chamber after a process is completed.

According to a configuration of the present disclosure, a process of cooling a main chamber in order to load and unload a powder after a process and re-heating the main chamber may be omitted, and thus a shortened process time, an increase in productivity, and an improvement in process efficiency can be achieved.

Figure 2:
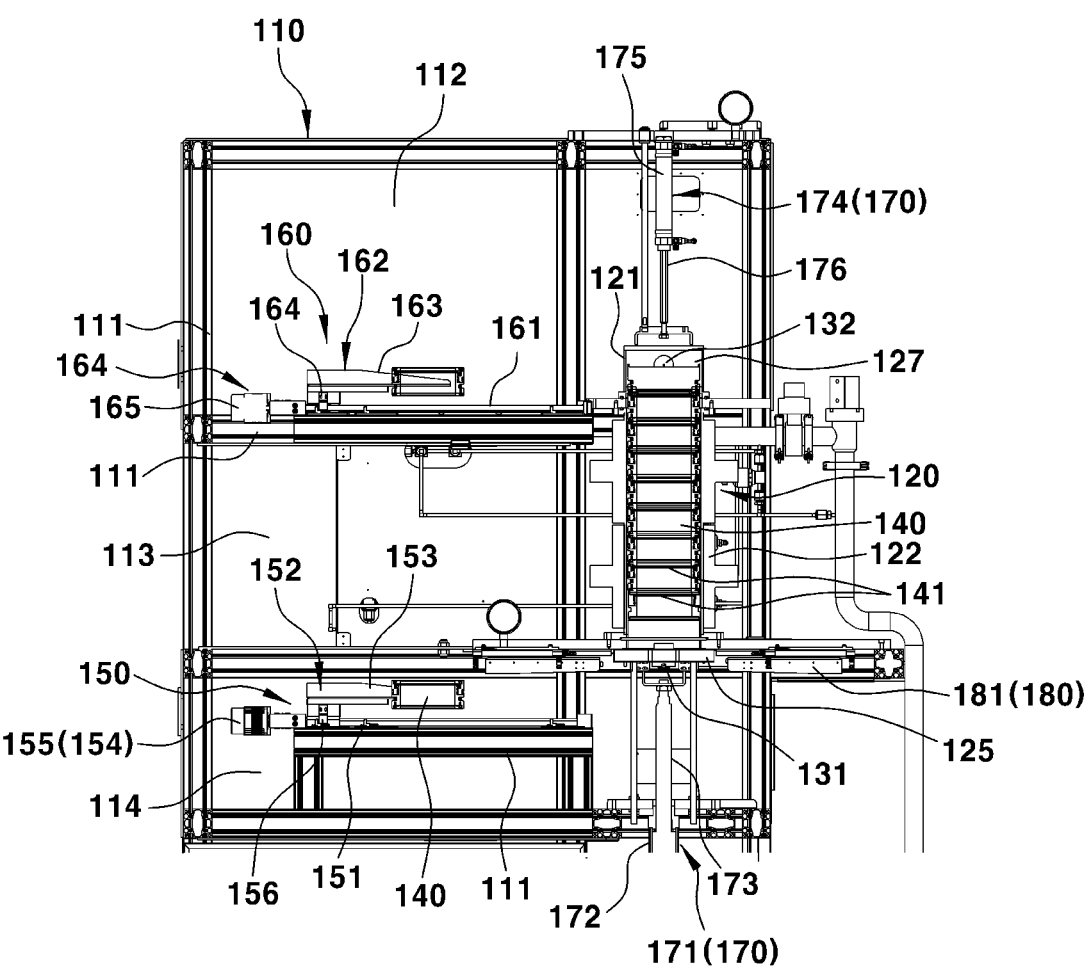
FIG. 2 is a view illustrating a configuration of a powder-surface treatment apparatus according to an embodiment of the present disclosure.
Figure 3:
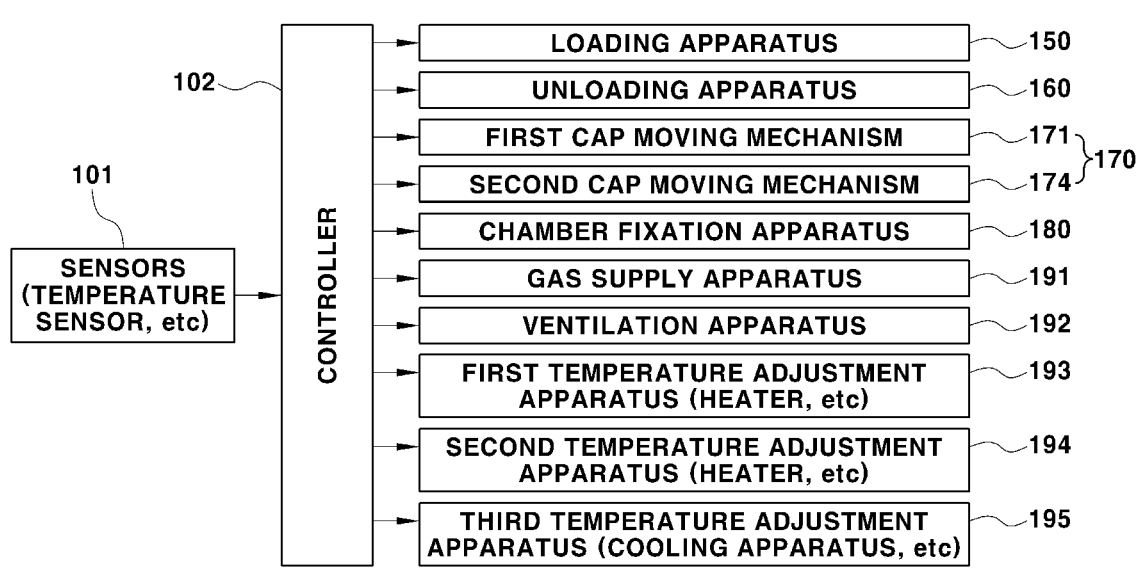
FIG. 3 is a block diagram illustrating a detection element, a control element, and an operation element in the powder-surface treatment apparatus according to an embodiment of the present disclosure.

FIG. 2 is a view illustrating a configuration of a powder-surface treatment apparatus according to an embodiment of the present disclosure. FIG. 2 illustrates a configuration of a surface treatment apparatus 100 in which sub-chambers 140 are loaded on top of each other in a multi-step configuration inside a main chamber 120. FIG. 3 is a block diagram illustrating a detection element, a control element, and an operation element in the powder-surface treatment apparatus according to an embodiment of the present disclosure.

According to embodiments of the present disclosure, loading and unloading mean loading and unloading, respectively, of the powder that has to undergo a surface treatment process. Specifically, inserting the sub-chamber 140 containing the powder into the main chamber 120 is hereinafter referred to as "loading" the sub-chamber 140, and discharging the sub-chamber 140 undergoing the surface treatment process from the main chamber 120 as hereinafter referred to as "unloading" the sub-chamber 140.

The powder-surface treatment apparatus 100 according to an embodiment of the present disclosure may be provided as a powder atomic layer deposition (ALD) apparatus for coating a surface of the powder inside the sub-chamber 140 by sequentially injecting precursor gas, purge gas, and reactant gas into the sub-chamber 140 for making them to pass therethrough in a state where the sub-chamber 140 is filled with the powder and where a temperature inside the sub-chamber 140 is kept high.

As illustrated, the powder-surface treatment apparatus 100 according to an embodiment of the present disclosure may include a housing 110 having an internal space of which at least one portion is possibly sealed up, a main chamber 120 installed in the internal space in the housing 110 and having an accommodation space 121 in which a surface treatment process is performed using atomic layer deposition (ALD), an injection unit 131 provided on one end portion of the main chamber 120 in such a manner that gas is injected into the accommodation space 121 in the main chamber 120 through the injection unit 131, and a discharging unit 132 provided on the other end portion of the main chamber 120 in such a manner that the gas is discharged from the accommodation space 121 in the main chamber 120 through the discharging unit 132.

The powder-surface treatment apparatus 100 according to an embodiment of the present disclosure may further include a plurality of sub-chambers 140 loaded into the accommodation space 121 that is an internal space in the main chamber 120 and arranged to be stacked on top of each other in the multi-step configuration along a lengthwise direction of the main chamber 120, that is, along an upward-downward direction on the drawing, a loading apparatus 150 inserting and loading a new sub-chamber 140 into the accommodation space 121 in the main chamber 120, and an unloading apparatus 160 discharging and unloading the sub-chamber 140 undergoing a process, among the plurality of sub-chambers 140 arranged to be stacked on top of each other in the multi-step configuration, from the accommodation space 121 in the main chamber 120.

The housing 110 is a structure in the form of a small room that has a sealed-up internal space. The housing 110 may be configured by combining plate members (not illustrated) on a frame 111 that serves as a skeleton, in such a manner as to form outside walls of the sealed-up space. In this case, the housing 110, as a whole, may have substantially the shape of a hexahedron. The housing 110 may be assembled by arranging the plate members in such a manner as to form front and rear portions, both lateral portions, and upper and lower portions of the hexahedron, as the outside walls of the housing 110.

The plate members forming the outside walls of the housing 110, that is, the front and rear portions, both lateral portions, and the upper and lower portions may be manufactured of a heat-resistant material. At least one portion of the plate member may be manufactured of a transparent material, such as tempered glass. In addition, although not illustrated in the drawings, a door that opens and closes the internal space in the housing 110 may be installed on the front portion or the lateral portion of the housing 110.

The housing 110 may have a structure in which the internal space thereof is partitioned, by the frame in and the plate members, into three spaces that are upper, middle, and lower spaces, that is, an upper room 112, a middle room 113, and a lower room 114.

Among these rooms, the loading apparatus 150 is installed in the lower room 114 of which an internal space is possibly sealed up, and the unloading apparatus 160 is installed in the upper room 112 of which an internal space is possibly sealed up. Accordingly, the lower room 114 and the upper room 112 become spaces in which the sub-chamber 140 is loaded and unloaded, respectively. In the housing 110, the middle room 113 is positioned between the upper room 112 and the lower room 114.

As described above, in the sealed-up internal space in the housing 110 that is filled with inert gas, that is, in the sealed-up internal space in the lower room 114, the loading apparatus 150 loads the new sub-chamber 140 into the accommodation space 121 in the main chamber 120. Along with this, a first cap moving mechanism 171 moves the plurality of sub-chambers 140 arranged to be stacked on top of each other inside the accommodation space 121 in the main chamber 120, along the accommodation space 121.

In addition, in the sealed-up internal space in the housing 110 that is filled with the inert gas, that is, in the sealed-up internal space in the upper room 112, the unloading apparatus 160 discharges and unloads at least one (the uppermost sub-chamber) of the plurality of sub-chambers 140 arranged to be stacked on top of each other inside the accommodation space 121 in the main chamber 120, from the accommodation space 121.

When the sub-chamber 140 undergoing a powder treatment process is unloaded and the new sub-chamber is loaded in this manner in the powder-surface treatment apparatus 100, the plurality of sub-chambers 140 arranged to be stacked on top of each other inside the accommodation space 121 in the main chamber 120 are in a state of being moved in a stepwise manner from a first opening that is a lower-end opening in the main chamber 120 toward a second opening that is an upper-end opening in the main chamber 120.

Figure 4:
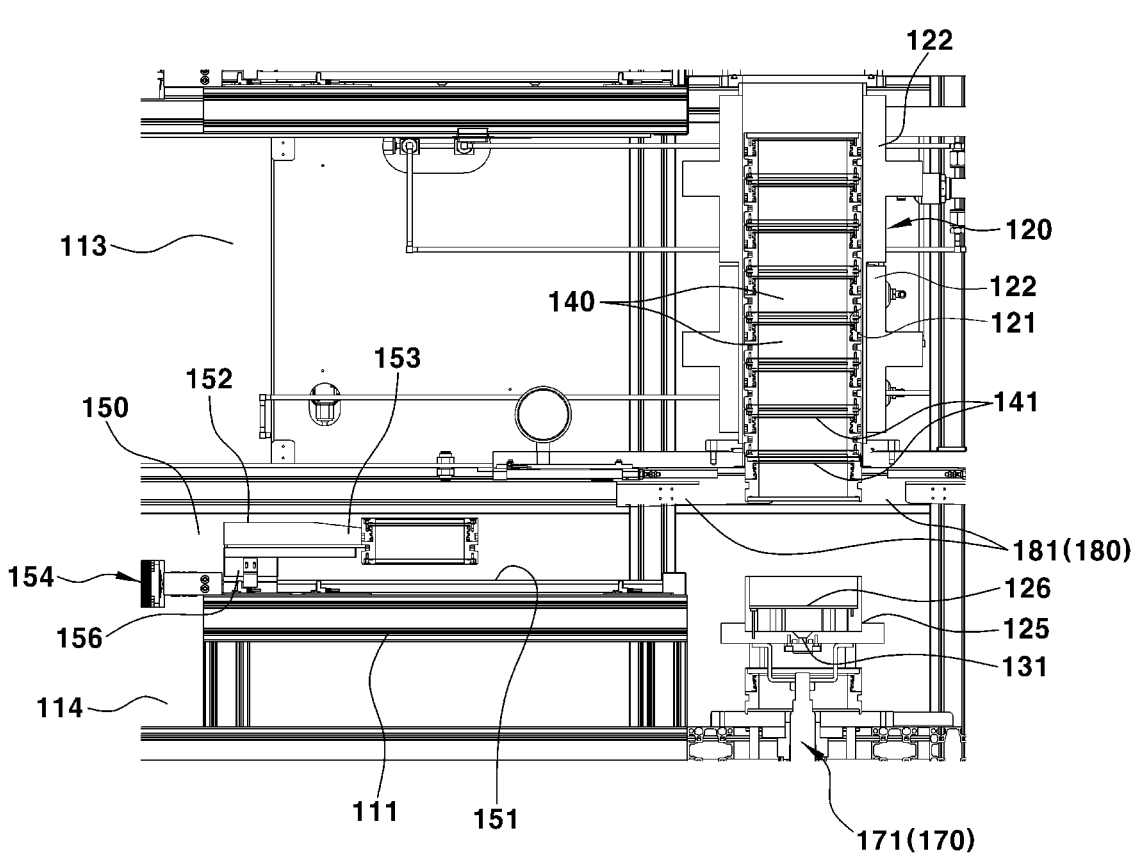
FIG. 4 is a view illustrating a loading apparatus in the powder-surface treatment apparatus according to an embodiment of the present disclosure.
Figure 5:
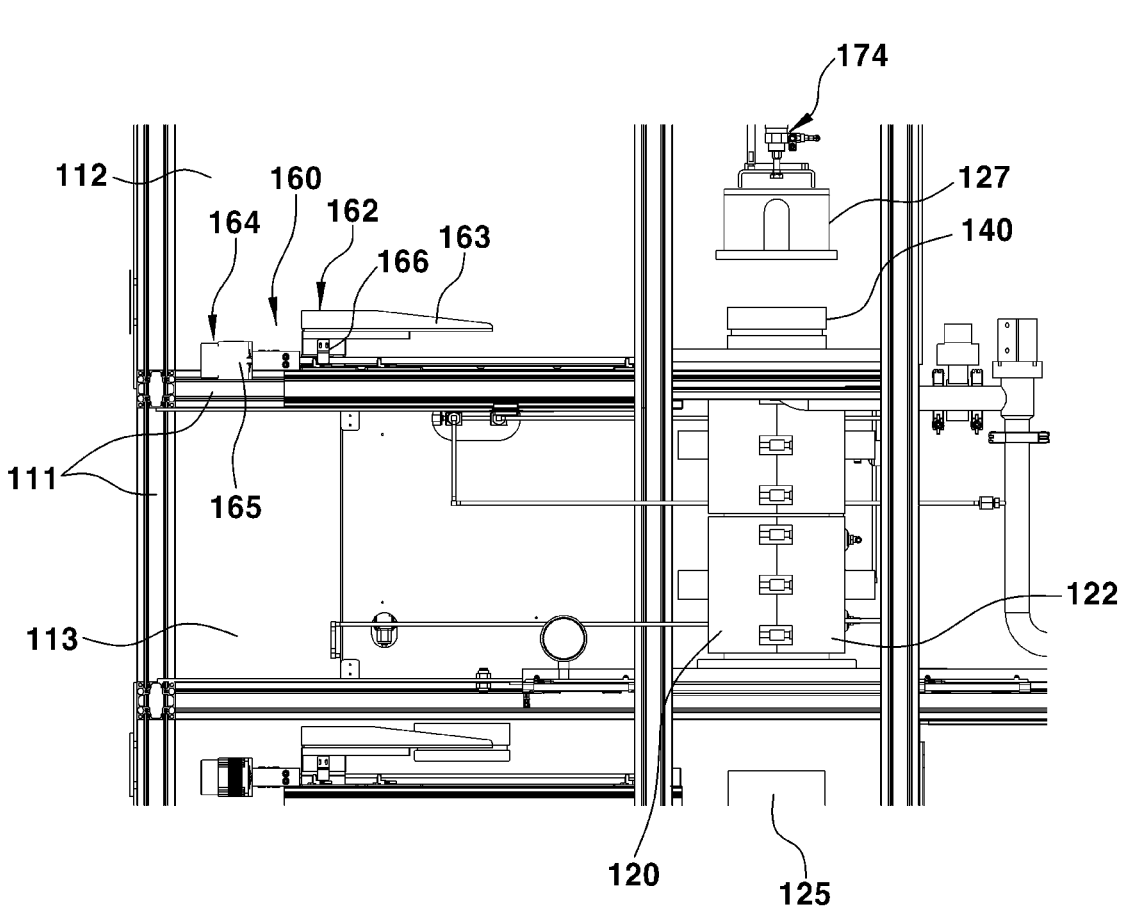
FIG. 5 is a view illustrating an unloading apparatus in the powder-surface treatment apparatus according to an embodiment of the present disclosure.

FIG. 4 is a view illustrating the loading apparatus in the powder-surface treatment apparatus according to an embodiment of the present disclosure. FIG. 5 is a view illustrating the unloading apparatus in the powder-surface treatment apparatus according to an embodiment of the present disclosure.

As illustrated, the loading apparatus 150 may be installed in the lower room 114 in such a manner that the sub-chamber 140 is loaded, and the unloading apparatus 160 may be installed in the upper room 112 in such a manner that the sub-chamber 140 is unloaded.

In this case, among the internal spaces in the housing 110, the lower room 114 in which the sub-chamber 140 is loaded, and the upper room 112 in which the sub-chamber 140 is unloaded may be configured as sealed-up spaces. During the surface treatment process, the upper room 112 and the lower room 114 may be supplied with the inert gas through a gas supply pipe connected to a gas supply unit (not illustrated) and may be filled therewith. $N_2$, Ar, or the like may be used as the inert gas.

In this manner, the lower room 114 in which the sub-chamber 140 is loaded (the powder is loaded) and the upper room 112 in which the sub-chamber 140 is unloaded (the powder is unloaded) may be filled with the inert gas. Thus, the powder inside the sub-chamber 140 that is loaded or unloaded may be blocked from being brought into contact with oxygen or moisture in air and thus may be prevented from being oxidized.

The main chamber 120 is configured to include a chamber main body 122 in which the accommodation space 121 is formed and which has a predetermined length, and a first end cap 125 and a second end cap 127 that are combined with an end portion of the chamber main body 122 or are separated from the end portion of the chamber main body 122 in such a manner as to seal up or open the internal space (the accommodation space) in the chamber main body 122. The internal space in the chamber main body 122 is the accommodation space 121 in the main chamber 120 in which the sub-chamber 140 is loaded and unloaded.

Among the constituent elements described above, the chamber main body 122 of the main chamber 120 is fixedly installed on the frame 111 or the plate member inside the housing 110 and may be a pipe-shaped hollow structure that has a predetermined length. In this case, in the housing 110, the chamber main body 122 of the main chamber 120 may be fixed in such a manner that the accommodation space 121 that is the internal space in the chamber main body 122 is arranged to extend over a long distance along the upward-downward direction.

In addition, the chamber main body 122 of the main chamber 120 may be installed in such a manner as to have an arrangement structure connecting the upper room 112 and the lower room 114 to each other. In this case, a lower end portion of the chamber main body 122 is positioned in the lower room 114 in the housing 110 and an upper end portion of the chamber main body 122 is positioned in the upper room 112 in the housing 110.

In addition, a lower-end opening (the first opening) in the chamber main body 122 is positioned in the lower room 114, and an upper-end opening (the second opening) in the chamber main body 122 is positioned in the upper room 112. At this case, the internal space (the accommodation space) in the chamber main body 122 communicates with the lower room 114 through the lower-end opening, and the internal space (the accommodation space) in the chamber main body 122 communicates with the upper room 112 through the upper-end opening. The lower-end opening in the chamber main body 122 is hereinafter referred to as the "first opening" and the upper-end opening in the chamber main body 122 is hereinafter referred to as the "second opening."

In a practical example of an embodiment of the present disclosure, the chamber main body 122 of the main chamber 120 may have the shape of a pipe with a circular cross section, particularly, the shape of a circular pipe with a constant inner diameter. In this case, the accommodation space 121 in the main chamber 120 may be a space with a circular cross section that extends over a long distance in the upward-downward direction.

In addition, the plurality of sub-chambers 140 may also have the shape of a container with a circular cross section in such a manner that the plurality of sub-chambers 140 may be moved, in the upward-downward direction in a state of being stacked on top of each other, along the accommodation space 121 in the main chamber 120. In this manner, a transverse cross section of the main chamber 120 and a transverse cross section of the sub-chamber 140 have the same shape. Thus, it is possible that the plurality of sub-chambers 140 arranged to be stacked on top of each other in the multi-step configuration inside the accommodation space 121 in the main chamber 120 are moved upward and downward along the accommodation space 121.

A chamber that has the shape of a pipe having a constant transverse cross-sectional area instead of the above-mentioned circular pipe may be used as the chamber main body 122 of the main chamber 120. In this case, the sub-chamber 140 may also have the same shape of a transverse cross section as the chamber main body 122 in such a manner as to be movable in the upward-downward direction inside the accommodation space 121 in the main chamber 120.

The first end cap 125 is installed in such a manner as to open and close the first opening that is the lower-end opening in the chamber main body 122. The first end cap 125 may be moved upward and downward in order to open and close the first opening and thus may be combined with the first opening in the chamber main body 122 or may be separated therefrom.

In addition, the second end cap 127 is installed in such a manner as to open and close the second opening that is the upper-end opening in the chamber main body 122. The second end cap 127 may be moved upward and downward in order to open and close the second opening and thus may be combined with the second opening in the chamber main body 122 or may be separated therefrom.

At this point, the first opening in the chamber main body 122 is positioned in the lower room 114. Therefore, the first end cap 125 is also provided in such a manner as to be moved in the upward-downward direction in the lower room 114 of the internal space in the housing 110. Moreover, the second opening in the chamber main body 122 is positioned in the upper room 112. Therefore, the second end cap 127 is provided in such a manner as to be moved in the upward-downward direction in the upper room 112 of the internal space in the housing 110.

In addition, when the first end cap 125 and the second end cap 127 both close the openings in the chamber main body 122, the internal space in the chamber main body 122, that is, the accommodation space 121 in the main chamber 120, is sealed up.

In addition, the sub-chamber 140 is loaded into the accommodation space 121 in the main chamber 120 through the first opening in the chamber main body 122. Therefore, when the sub-chamber 140 is loaded, the first end cap 125 descends and opens the corresponding opening in the chamber main body 122.

Conversely, the sub-chamber 140 is unloaded out of the accommodation space 121 in the main chamber 120 through the second opening in the chamber main body 122. Therefore, when the sub-chamber 140 is unloaded, the second end cap 127 ascends and opens the second opening in the chamber main body 122.

The powder-surface treatment apparatus 100 according to an embodiment of the present disclosure may further include a cap moving mechanism 170 that moves upward and downward the first end cap 125 and the second end cap 127 in the main chamber 120 in such a manner as to selectively seal up or open the accommodation space 121 in the main chamber 120.

The cap moving mechanism 170 is configured to include a first cap moving mechanism 171 that moves the first end cap 125 upward and downward, and a second cap moving mechanism 174 that moves the second end cap 127 upward and downward.

In this case, the first end cap 125 is combined with a drive unit of the first cap moving mechanism 171, and the second end cap 127 is combined with a drive unit of the second cap moving mechanism 174 in such a manner as to move the first end cap 125 or the second end cap 127 independently of each other.

Accordingly, when the first cap moving mechanism 171 operates and thus a drive unit 173 (a piston rod described below) is moved upward and downward, the first end cap 125 is moved together with the drive unit 173, and thus the first opening in the chamber main body 122 is opened and closed. As a result, the accommodation space 121 in the main chamber 120 may be sealed up or opened by the first end cap 125.

Likewise, when the second cap moving mechanism 174 operates and thus a drive unit 176 (a piston rod described below) is moved upward and downward, the second end cap 127 is moved together with the drive unit 176, and thus the second opening in the chamber main body 122 is opened and closed. As a result, the accommodation space 121 in the main chamber 120 is sealed up or opened by the second end cap 127.

In a practical example of an embodiment of the present disclosure, the first cap moving mechanism 171 and the second cap moving mechanism 174 may be hydraulic or pneumatic cylinder mechanisms in which the piston rods 173 and 176, respectively, are moved forward and backward by hydraulic or pneumatic pressure in cylinder main bodies 172 and 175 that are fixed inside the housing 110.

The piston rods 173 and 176 that are moved in the backward-forward direction in the cylinder mechanisms, respectively, are the respective drive units of the corresponding cap moving mechanisms 171 and 174. The corresponding end caps 125 and 127 are mounted on end portions, respectively, of the piston rods 173 and 176. Thus, when the piston rods 173 and 176 are moved in the backward-forward direction, the end caps 125 and 127 are moved together.

In a practical example of an embodiment of the present disclosure, the first cap moving mechanism 171 and the second cap moving mechanism 174 are fixedly mounted on the frame 111 or the plate member of the housing 110, and are installed in such a manner as to extend over a long distance in the upward-downward direction in the internal space in the housing 110.

In addition, the first cap moving mechanism 171 may be installed in such a manner as to be positioned under the main chamber 120, and the second cap moving mechanism 174 may be installed in such a manner as to be positioned over the main chamber 120. The first cap moving mechanism 171 may be installed in the lower room 114 in the housing 110 in such a manner as to be positioned under the main chamber 120, and the second cap moving mechanism 174 may be installed in the upper room 112 in the housing 110 in such a manner as to be positioned over the main chamber 120.

In this case, the first cap moving mechanism 171 and the second cap moving mechanism 174 may be installed in such a manner as to be arranged to extend over a long distance vertically in the upward-downward direction in the lower room 114 and the upper room 112, respectively, in the housing 110. Moreover, the piston rods 173 and 176 may be installed in such a manner as to be moved forward and backward vertically in the upward-downward direction in the lower room 114 and the upper room 112, respectively.

In the first cap moving mechanism 171, the first end cap 125 may be mounted on an upper end portion of the piston rod 173. As the piston rod 173 of the first cap moving mechanism 171 is moved forward and backward, the first end cap 125 may be moved upward and downward vertically.

Likewise, in the second cap moving mechanism 174, the second end cap 127 may be mounted on a lower end portion of the piston rod 176. As the piston rod 176 of the second cap moving mechanism 174 is moved forward and backward, the second end cap 127 may be moved upward and downward in a straight line.

Operation of each of the first cap moving mechanism 171 and the second cap moving mechanism 174 is controlled according to a control signal that is output by a controller 102 (refer to FIG. 3). At this point, according to the control signal that is output by the controller 102, the piston rods 173 and 176 that are the drive units of the cap moving mechanism 170 are controlled in such a manner as to be moved forward and backward by a predetermined length of a stroke.

Consequently, as the piston rod 173 or the piston rod 176 is moved forward or backward, the first end cap 125 or the second end cap 127 is moved upward and downward, and thus the openings in the main chamber 120 (the chamber main body) are opened and closed. When the first end cap 125 ascends and thus is combined with the first opening in the main chamber 120 (the chamber main body), the first opening is closed. Moreover, when the second end cap 127 descends and thus is combined with the second opening in the main chamber 120 (the chamber main body), the second opening is closed.

Conversely, when the first end cap 125 ascends and thus is separated from the first opening in the main chamber 120, the first opening is opened, and when the second end cap 127 ascends and thus is separated from the second opening in the main chamber 120, the second opening is opened.

In a state where the two end caps 125 and 127 close the corresponding openings at the same time, the accommodation space 121 in the main chamber 120 is in a sealed-up state. When at least one of the two end caps 125 and 127 opens the corresponding opening, the accommodation space 121 in the main chamber 120 is in an open state.

The first end cap 125 may be one end portion of the main chamber 120, and the injection unit 131 through which gas is injected into the accommodation space 121 in the main chamber 120 may be formed in the first end cap 125.

In this case, the second end cap 127 may be the other end portion of the main chamber 120, and the discharging unit 132 through which gas is discharged from the accommodation space 121 in the main chamber 120 may be formed in the second end cap 127.

The injection unit 131 formed in the first end cap 125 communicates with a mesh structure 126 provided inside the first end cap 125. Micro-holes are formed in the mesh structure 126. Raw gas, purge gas, and reactant gas that are supplied through the injection unit 131 may pass through the micro-holes.

In addition, a gas supply pipe of a gas supply apparatus 191 (in FIG. 3) for supplying the raw gas, the purge gas, and the reactant gas to the sub-chamber 140 is connected to the injection unit 131 in the main chamber 120. Components for selectively supplying gas, such as valves, are installed on the gas supply pipe.

A known gas supply apparatus used in a normal atomic layer deposition apparatus may be adopted and used as the gas supply apparatus 191 that, as described above, is configured to selectively supply the raw gas, the purge gas, and the reactant gas to the injection unit 131 in the main chamber 120. A detailed description of a configuration of this gas supply apparatus is omitted from the present specification.

In addition, an internal space in the second end cap 127 is a space in which the uppermost sub-chamber 140 arranged inside the accommodation space 121 in the main chamber 120 may be accommodated. In addition, the internal space in the second end cap 127 and an internal space in the uppermost sub-chamber 140 have their respective structures that make them communicate with each other in such a manner that gas flows therethrough.

In a practical example of an embodiment of the present disclosure, a lower portion of each of the plurality of sub-chambers 140 or the lower portions and an upper portion of each of the plurality of sub-chambers 140 have a mesh structure 141 that allows gas to pass through. In a practical example of an embodiment of the present disclosure, the sub-chamber 140 may have the same shape or configuration as disclosed in Patent Document 1.

During a surface treatment process in which the accommodation space 121 in the main chamber 120 and the sub-chamber 140 inside the accommodation space 121 are kept at a predetermined process temperature, the atomic layer deposition (ALD) process may be performed by bringing gas containing a source material (starting material), that is, raw gas, into contact with the powder with which the sub-chamber 140 is filled.

Gas injected into the accommodation space 121 in the main chamber 120 through the injection unit 131 is caused to pass through the powder-filled internal space in each of the plurality of sub-chambers 140 arranged to be stacked on top of each other in the multi-step configuration inside the accommodation space 121 in the main chamber 120. In addition, the gas passing through the internal space in each of the plurality of sub-chambers 140 is discharged out of the main chamber 120 through the discharging unit 132.

Micro-holes are formed in the mesh structure 141 of each of the plurality of sub-chambers 140. The micro-hole has a larger size than a particle contained in gas, but a smaller size than the powder. For example, the micro-hole may have a diameter of 10 $\mu$m to 100 $\mu$m.

A ventilation apparatus 192 (in FIG. 3) for venting out gas inside the main chamber 120 and the sub-chamber 140 is connected to the discharging unit 132 in the second end cap 127.

The ventilation apparatus 192 configured to vent out the gas inside the main chamber 120 and the sub-chamber 140 through the discharging unit 132 may be configured to include a ventilation pipe, a valve, a pump that absorbs the gas through the ventilation pipe in order to vent out the gas, and the like.

In a practical example of an embodiment of the present disclosure, a known ventilation apparatus used in the normal atomic layer deposition apparatus may be adopted and used as the ventilation apparatus 192. A detailed description of a configuration of this ventilation apparatus is omitted from the present specification.

The loading apparatus 150 is an apparatus for loading the new sub-chamber 140 to be inserted to undergo the surface treatment process, from the lower room 114 in the housing 110 into the accommodation space 121 in the main chamber 120.

The loading apparatus 150 moves the new sub-chamber 140 to be loaded into the accommodation space 121 in the main chamber 120 to a predetermined loading position in a state where the first end cap 125 is open. When the first end cap 125 is open, the loading apparatus 150 moves the new sub-chamber 140 to a loading position over the first end cap 125.

In a practical example of an embodiment of the present disclosure, the loading apparatus 150 is configured to include a bed 151 installed in a space under the main chamber 120 in the housing 110, that is, in the lower room 114 in the housing 110, a gripping mechanism mounted in such a manner as to be movable along a path preset on the bed 151 and moving the sub-chamber 140 to be inserted to undergo the surface treatment process to the loading position over the first end cap 125, in a state of fixedly holding the sub-chamber 140, and a moving mechanism 154 moving the gripping mechanism 152 along the preset path on the bed 151.

The loading apparatus 150 is provided in such a manner that operation thereof is controlled according to the control signal that is output by the controller 102. Specifically, among the constituent elements of the loading apparatus 150, operation of each of the gripping mechanism 152 and the moving mechanism 154 is controlled by the control signal that is output by the controller 102.

The bed 151 may be mounted on the frame 111 of the housing 110 or on a separate support fixed to the frame in, and is installed in such a manner as to be arranged under the main chamber 120 in the lower room 114 in the housing 110.

In addition, a movement path for the gripping mechanism 152 is set to be on the bed 151. The gripping mechanism 152 is moved toward the main chamber 120 in a state of gripping the new sub-chamber 140 to be inserted to undergo the surface treatment process. Alternatively, when loading is finished, the gripping mechanism 152 may be moved in the reverse direction.

In the loading apparatus 150, the gripping mechanism 152 may be a robot arm mechanism that can grip and thus fix the sub-chamber 140. In this case, according to the control signal that is output by the controller 102 (in FIG. 3), the robot arm mechanism is controlled in such a manner that the robot arm mechanism grips and thus fixes the sub-chamber 140 or in such a manner that the sub-chamber 140 is no longer in a state of being gripped and thus fixed. For example, the robot arm mechanism may have a gripper 153 that presses against an outer circumferential surface, that is, a lateral surface, of the sub-chamber 140 and thus holds the sub-chamber 140.

When the gripping mechanism 152 is moved forward to the loading position, in a state of fixedly holding the sub-chamber 140 to be inserted to undergo the surface treatment process, the sub-chamber 140 fixed to the gripping mechanism 152 is set to be positioned at a height under the first opening in a lower end portion of the chamber main body 122 of the main chamber 120 and at a height over the first end cap 125 that is moved downward in order to open the accommodation space 121 in the main chamber 120.

The moving mechanism 154 may be configured in such a manner as to linearly move the gripping mechanism 152 along a straight-line path, set to be on the bed 151, according to the control signal that is output by the controller 102.

One of known linear actuators that are configured to be installed in such a manner as to be interposed between the bed 151 and the gripping mechanism 152 may be adopted as the moving mechanism 154. For example, a linear motion mechanism including the motor 155, a ball screw (not illustrated), and a guide rail (not illustrated) may be used as the moving mechanism 154.

The ball screw may include a screw rod (not illustrated) that is mounted in such a manner as to be rotated by a motor 155 and a moving block (not illustrated) combined with the screw rod. With this configuration, the moving block or a separate slider 156 combined with the moving block is combined with the guide rail. The guide rail is provided on the bed 151 in such a manner as to extend over a long distance along the movement path for the gripping mechanism 152.

The screw rod is mounted on the bed 151 in a state of being supported on a bearing and is provided in such a manner as to be rotated together with a rotor shaft of the motor 155 and thus to be rotated by the motor 155. Forward rotation and backward rotation of the motor 155 is controlled according to the control signal that is output by the controller 102.

The gripping mechanism 152 is mounted on the moving block or the slider 156. When the screw rod of the ball screw is rotated, the moving block or the slider 156 is moved along the guide rail. At this point, the gripping mechanism 152 is moved together with the moving block or the slider 156.

Consequently, driving and a rotation direction of the motor 155 are controlled according to the control signal that is output by the controller 102. Thus, the gripping mechanism 152 may be moved forward to a position at which to load the sub-chamber 140 or may be moved backward after the loading is completed.

Alternatively, a linear motion mechanism including a motor, a belt, a slider, and a guide rail may be used as the moving mechanism 154. A linear motor or the like may also be adopted and used as the moving mechanism 154.

Any moving mechanism 154 that can move the gripping mechanism 152 forward or backward along the path, set to be on the bed 151, according to the control signal that is output by the controller 102 may be adopted without restriction.

All or some of the constituent elements of the unloading apparatus 160 may be the same as those of the loading apparatus 150, except that they are different in installation positions in the housing 110, functions, and purposes from those of the loading apparatus 150.

That is, the unloading apparatus 160 is configured to include a bed 161 installed in a space over the main chamber 120 in the housing 110, that is, in the upper room 112 in the housing 110, a gripping mechanism 162 mounted in such a manner as to be movable along a path that is set to be on the bed 161, and moving the sub-chamber 140 undergoing the surface treatment process from a gripping position under the second end cap 127 to a predetermined waiting position (unloading position), in a state of fixedly holding the sub-chamber 140, and a moving mechanism 164 moving the gripping mechanism 162 along the path that is set to be on the bed 161.

The unloading apparatus 160 is also provided in such a manner that operation thereof is controlled according to the control signal that is output by the controller 102 (refer to FIG. 3). Specifically, among the constituent elements of the unloading apparatus 160, operation of each of the gripping mechanism 162 and the moving mechanism 164 is controlled according to the control signal that is output by the controller 102.

In the unloading apparatus 160, the bed 161 may be mounted on the frame 111 of the housing 110 or on a separate support fixed to the frame in in the upper room 112 in the housing 110.

In addition, a movement path for the gripping mechanism 162 is set to be on the bed 161. The gripping mechanism 162 may be moved toward the main chamber 120 in order to grip the sub-chamber 140 undergoing the surface treatment process, or, after gripping the sub-chamber 140, may be moved in the reverse direction up to a predetermined waiting position (unloading position).

In the unloading apparatus 160, the gripping mechanism 162 may also be a robot arm mechanism that can grip and thus fix the sub-chamber 140. In this case, according to the control signal that is output by the controller 102 (in FIG. 3), the robot arm mechanism is controlled in such a manner that the robot arm mechanism grips and thus fixes the sub-chamber 140 or that the sub-chamber 140 is no longer in a state of being gripped and thus fixed. For example, the robot arm mechanism may have a gripper 163 that presses against the outer circumferential surface, that is, the lateral surface, of the sub-chamber 140 and thus holds the sub-chamber 140.

The moving mechanism 164 may be configured in such a manner as to linearly move the gripping mechanism 162 along the straight-line path, set to be on the bed 161, according to the control signal that is output by the controller 102. One of known linear actuators that are configured to be installed in such a manner as to be interposed between the bed 161 and the gripping mechanism 162 may be adopted as the moving mechanism 164. For example, a linear motion mechanism including the motor 155, a ball screw (not illustrated), and a guide rail (not illustrated) may be used as the moving mechanism 164.

When, in the unloading apparatus 160, the gripping mechanism 162 is moved forward by the moving mechanism 164 and thus the gripper 163 of the gripping mechanism 162 reaches the gripping position, a height of the gripper 163 of the gripping mechanism 162 is set to be higher than a height of the second opening in the upper end portion of the chamber main body 122. In addition, the height of the gripper 163 is set to a height at which to grip the uppermost sub-chamber 140 that is completely discharged upward through the second opening in the chamber main body 122 after the surface treatment process is completed.

Accordingly, in a state where the gripping mechanism 162 is moved forward and grips the uppermost sub-chamber 140 undergoing the surface treatment process, using the gripper 163, the gripping mechanism 162 is moved backward by the moving mechanism 164. When this is done, the sub-chamber 140 fixed to the gripper 163 may be moved away from the main chamber 120 and may be moved to the waiting position for discharging in the upper room 112 in the housing 110.

The powder-surface treatment apparatus 100 according to an embodiment of the present disclosure may further include a chamber fixation apparatus 180. In a state where the plurality of sub-chambers 140 are arranged to be stacked on top of each other in the multi-step configuration inside the accommodation space 121 in the main chamber 120, the first end cap 125 ascends to a predetermined height, and thus the first opening in the main chamber 120 (the chamber main body) is open. When this is done, the chamber fixation apparatus 180 fixes the lowermost sub-chamber 140, among the plurality of sub-chambers 140, at a predetermined height in order to prevent the plurality of sub-chambers 140 stacked on top of each other inside the accommodation space 121 in the main chamber 120 from falling due to their weights.

The chamber fixation apparatus 180 is configured to include a pair of locking blocks 181 that are combined with a guide unit installed on the frame 111 of the housing 110 in a manner that is movable forward and backward and a block driving mechanism (not illustrated) moving the pair of locking blocks 181 forward and backward.

As is the case with the loading apparatus 150 and the unloading apparatus 160, operation of the block driving mechanism may also be controlled according to the control signal that is output by the controller 102. Accordingly, the block driving mechanism moves the corresponding locking block 181 forward and backward according to the control signal that is output by the controller 102.

The guide unit is installed on the frame in of the housing 110 in a manner that extends horizontally over a long distance. The pair of locking blocks 181 is provided in such a manner as to be movable along the guide unit.

The locking blocks 181 are arranged to both sides, respectively, of the main chamber 120, with the main chamber 120 in between. The guide unit is also installed on portions of the frame 111 that are positioned to both sides, respectively, of the main chamber 120 in a manner that extends horizontally over a long distance, with the main chamber 120 in between.

One block driving mechanism may be installed on each of the locking blocks 181 in order to move each of the locking blocks 181 forward and backward. The block driving mechanism may be mounted on the frame 111 of the housing 110.

The block driving mechanism may be a pneumatic or hydraulic cylinder mechanism having a piston rod (not illustrated) that moves horizontally forward and backward. Each of the locking blocks 181 may be combined with an end portion of the piston rod of the corresponding block driving mechanism. When the piston rod is moved forward and backward, the locking block 181 is moved together with the piston rod, and thus is moved forward and backward along the guide unit.

In addition, each of the locking blocks 181 may be moved forward toward the center or may be moved backward in the reverse direction by the block driving mechanism. When each of the locking blocks 181 is moved forward toward the center, the sub-chamber 140 may be fixed (locked).

That is, the pair of locking blocks 181 is moved along the guide unit toward the main chamber 120 positioned therebetween and presses against the lowermost sub-chamber 140, among the plurality of sub-chambers stacked on top of each other in the multi-step configuration, in a state of being brought into contact therewith. Thus, the pressed sub-chamber 140 is fixed without falling.

When the lowermost sub-chamber 140, as described above, is in a state of being fixed (locked) by the pair of locking blocks 181, the sub-chambers 140 stacked on top of each other above the lowermost sub-chamber 140 are supported by the lowermost sub-chamber 140 in such a manner as not to fall out of the accommodation space 121 in the main chamber 120.

When the pair of locking blocks 181 fixing the lowermost sub-chamber 140, as described above, are moved backward and thus are separated from the sub-chamber 140, the sub-chamber 140 may be unfixed by the locking block 181 and the chamber fixation apparatus 180 configured to include the locking block 181.

The cylinder mechanism is described above as being used as the block driving mechanism. However, the block driving mechanism is a mechanism linearly moving each of the locking blocks 181. Therefore, as is the case with the respective movement mechanisms 154 and 164 of the loading apparatus 150 and the unloading apparatus 160, that is, the movement mechanisms that move the gripping mechanisms 152 and 162 forward and backward, respectively, one of known linear actuators may also be adopted and used as the block driving mechanism.

For example, a linear motion mechanism including a motor, a ball screw, and a guide rail may be used as the movement mechanism. The guide rail here serves as the guide unit. In addition, the ball screw may include a screw rod mounted in such a manner as to be rotated by the motor and a moving block combined with the screw rod.

With this configuration, the moving block or a separate slider combined with the moving block is combined with the guide rail that is the guide unit. The guide rail is provided on the frame 111 in such a manner as to extend over a long distance along a predetermined movement path for the locking block 181.

The screw rod is mounted on the frame 111 in a state of being supported on the bearing. The screw rod is provided in such a manner as to be rotated together with a rotor shaft of the motor and thus to be rotated by the motor. Forward rotation and backward rotation of the motor are controlled according to the control signal that is output by the controller 102.

The locking block 181 is mounted on the moving block or the slider. When the screw rod of the ball screw is rotated, the moving block or the slider is moved along the guide rail that is the guide unit. At this point, the locking block 181 is moved together with the moving block or the slider.

Consequently, the driving and the rotation direction of the motor are controlled according to the control signal that is output by the controller 102. Thus, the locking block 181 is moved forward to a position at which to fix (lock) the lowermost sub-chamber 140 or is moved backward to a position at which to unfix (unlock) the lowermost sub-chamber 140.

Alternatively, a linear motion mechanism including a motor, a belt, a slider, and a guide rail may be used as the block driving mechanism and the guide unit. A linear motor or the like may be adopted and used as the block driving mechanism and the guide unit.

Any block driving mechanism that can move the locking block 181 forward or backward along the path, set to be on the frame 11, according to the control signal that is output by the controller 102 may be adopted without restriction.

Temperature adjustment apparatuses 193 and 194 (in FIG. 3) that can control the temperature of the sub-chamber 140 in such a manner as to remain the same as a setting temperature are provided in the lower room 114 and the upper room 112, respectively, in the housing 110. A temperature adjustment apparatus 195 (in FIG. 3) that can control the temperature of the accommodation space 121 in such a manner as to remain the same as the setting temperature is also provided in the main chamber 120.

The temperature adjustment apparatus 193 in the lower room 114 is hereinafter referred to as a "first temperature adjustment apparatus," the temperature adjustment apparatus 195 in the main chamber 120 is hereinafter referred to as a "second temperature adjustment apparatus," and the temperature adjustment apparatus 194 in the upper room 112 is hereinafter referred to as a "third temperature adjustment apparatus."

In a practical example of an embodiment of the present disclosure, the temperature inside the lower room 114 in the housing 110 in which the powder and the sub-chamber 140 are loaded may be maintained, by the first temperature adjustment apparatus 193, to be a predetermined high temperature and thus may be used as a pre-heating zone.

The first temperature adjustment apparatus 193 inside the lower room 114 is for pre-heating the sub-chamber 140 to be loaded soon and the powder inside the sub-chamber 140 to be loaded soon, and the third temperature adjustment apparatus 195 inside the upper room 112 is for cooling the post-unloading sub-chamber 140 and the powder inside the post-unloading sub-chamber 140.

In the upper room 112 and the lower room 114, all processes are performed in an atmosphere of inert gas. Specifically, in the upper room 112, preheating and loading processes are performed in the atmosphere of inert gas, and, in the lower room 114, unloading and cooling processes are also performed in the atmosphere of inert gas.

In a practical example of an embodiment of the present disclosure, the first temperature adjustment apparatus 193 in the lower room 114 for pre-heating includes a heater. The heater may be a jacket heater or a cartridge heater.

In addition, a heater may be installed inside the lower room 114 in the housing 110. For example, the heater may be installed in the loading apparatus 150. Specifically, the heater may be installed in the gripping mechanism 152 of the loading apparatus 150 that is set to be fixed immediately before the sub-chamber 140 to be newly inserted to undergo the surface treatment process is loaded.

In addition, a sensor 101, that is, a temperature sensor 101, may be installed in the lower room 114. The temperature sensor 101 serves to measure the temperature inside the lower room 114, the temperature of the loading apparatus 150 (for example, the temperature of the gripping mechanism 152), or the temperature of the sub-chamber 140 fixed to the loading apparatus 150. The controller 102 controls operation of the heater in such a manner that the temperature measured by the temperature sensor 101 is maintained to be a preset target temperature.

The sub-chamber 140 discharged from the accommodation space 121 in the main chamber 120 after undergoing the surface treatment process is positioned in the upper room 112 in which the sub-chamber 140 and the powder are unloaded. The sub-chamber 140 unloaded in the upper room 112 is the uppermost sub-chamber 140 inside the accommodation space 121 in the main chamber 120 during the surface treatment process.

The third temperature adjustment apparatus 195 keeps an internal space in the upper room 112 at a temperature relatively lower than a process temperature of the internal space (the accommodation space 121) in the main chamber 120. Thus, the internal space in the upper room 112 may be used as a cooling zone.

Accordingly, the unloaded sub-chamber 140 may be cooled in the upper room 112. In a state where the upper room 112 is kept at room temperature, the sub-chamber 140 may be cooled to room temperature inside the upper room 112.

In addition, the unloaded sub-chamber 140 may be cooled by the third temperature adjustment apparatus 195 installed inside the upper room 112. At this point, the third temperature adjustment apparatus 195 may be a cooling apparatus that forcibly cools the sub-chamber 140.

The cooling apparatus that forcibly cools the unloaded sub-chamber 140 in the upper room 112 may be a water-cooling-type cooling apparatus that cools the sub-chamber 140 using a coolant, or may be a cooling apparatus that cools the sub-chamber 140 using a cooling fan (not illustrated) installed in the upper room 112.

In a practical example of an embodiment of the present disclosure, the water-cooling-type cooling apparatus in the upper room 112 includes a coolant path (not illustrated) provided inside the upper room 112 in the housing 110. Specifically, the coolant path may be installed in the unloading apparatus 160.

Specifically, the coolant path may be installed in the gripping mechanism 162 by which the unloaded sub-chamber 140 is fixed, among the constituent elements of the unloading apparatus 160. In this case, the coolant path may be a coolant shield or a water jacket that is installed in the gripping mechanism 162 in such a manner that the coolant flows through the coolant shield or the water jacket.

In this manner, in the lower room 114, the sub-chamber 140 to be loaded to undergo the surface treatment process and the powder inside the sub-chamber 140 to be loaded are preheated. Thus, the time taken to stabilize the temperature of the loaded powder is shortened. Moreover, the powder inside the sub-chamber 140 unloaded after undergoing the surface treatment process is forcibly cooled in the upper room 112, and thus the delay that may occur due to the cooling is shortened.

Figure 6:
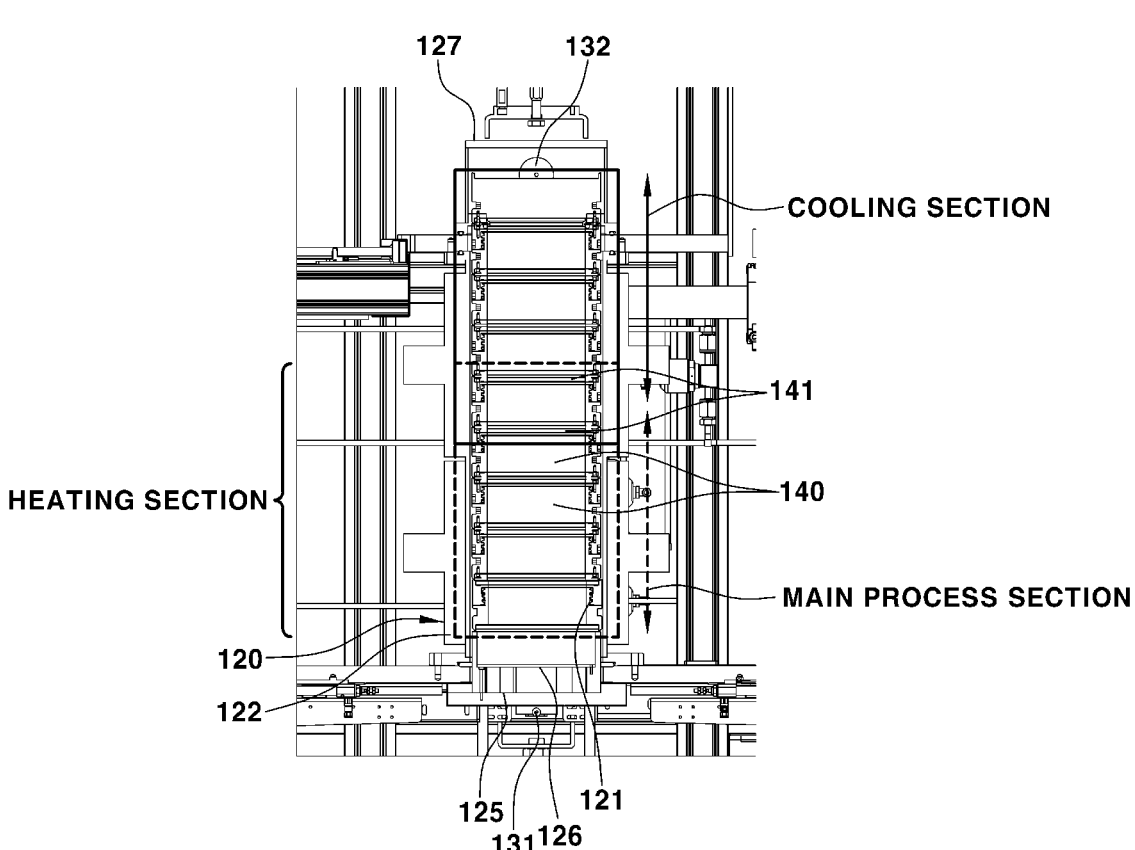
FIG. 6 is a view illustrating a state where a plurality of sub-chambers are stacked on top of each other inside an accommodation space in a main chamber in the powder-surface treatment apparatus according to an embodiment of the present disclosure.

FIG. 6 is a view illustrating a state where the plurality of sub-chambers 140 are stacked on top of each other inside the accommodation space in the main chamber 120 in the powder-surface treatment apparatus 100 according to an embodiment of the present disclosure.

As illustrated, in a practical example of an embodiment of the present disclosure, the plurality of sub-chambers 140 are arranged to be stacked on top of each other in the multi-step configuration inside the accommodation space 121 in the main chamber 120 in such a manner as to maximize a usage rate of a source material (starting material) to be deposited. At this point, the number of stacked sub-chambers 140 may be 2 to 10 depending on an environment and a condition for equipment.

As illustrated, the plurality of sub-chambers 140 are installed in the accommodation space 121 in the main chamber 120 in such a manner as to be arranged over a long distance to be stacked vertically on top of each other. Thus, the sub-chambers 140 may have the improved temperature uniformity. At least one accommodation space 121 in the main chamber 120 may be configured to have a plurality of heating sections (for example, 3 to 5 heating sections) in such a manner that the temperature is adjustable in a manner that varies with one process to another.

In a practical example of an embodiment of the present disclosure, the third temperature adjustment apparatus 195 (in FIG. 3) is installed in the main chamber 120. The third temperature adjustment apparatus 195 adjusts the temperature of each portion of the main chamber 120 on the basis of each predetermined section of the accommodation space 121.

The third temperature adjustment apparatus 195 is provided in such a manner as to perform an operation of adjusting the temperature of the main chamber 120 according to the control signal that is output by the controller 102. The third temperature adjustment apparatus 195 may include a heating apparatus, such as a heater, and may further include a cooling apparatus in addition to the heating apparatus. In this case, the cooling apparatus may be installed in the upper section, among the predetermined sections, in the main chamber 120, and the heating apparatus may be installed in the lower section, among the predetermined sections, in the main chamber 120.

Specifically, in a practical example of an embodiment of the present disclosure, a lower portion of the main chamber 120 may be configured as a heating section in which the sub-chamber 140 is heated by the heating apparatus, and the entire heating section or one portion thereof may be used as a main process section in which a substantial surface treatment process is performed in a state where the powder is heated.

In a practical example of an embodiment in FIG. 6, the main process section may be set as a section from the first-step section, that is, the lowest step section, to the fifth-step section. Temperature of the main process section may be adjusted to 100 to 300° C. or above according to the process temperature for the source material.

An upper portion of the main chamber 120, that is, an upper portion of the main process section in the main chamber 120, may be configured as a cooling section in which the powder is cooled by the cooling apparatus. The water jacket may be provided in the cooling section in the main chamber 120. The sub-chamber 140 in the cooling section inside the main chamber 120 and the powder inside the sub-chamber 140 in the cooling section may be cooled with the coolant at a temperature of 100° C. or below or at a low temperature that flows through the water jacket.

In the surface treatment apparatus 100 according to an embodiment of the present disclosure, the number of the sub-chambers 140 (the number of the steps) that constitute each of the main process section and the cooling section may vary according to the powder used and the source material (the starting material) with which the surface of the powder is coated.

In addition, basically, the source material passing through the main process section does not react in the cooling section. The number of the sub-chambers 140 (the number of steps) that constitute the cooling section may be set to be in a range in which the property of the source material does not deteriorate by a process by-product.

The heating section is configured to have three or more heating regions, depending on a length of the sub-chamber 140. It is desirable that the heating section is configured in such a manner that the temperature of the heating region is adjustable to up to 400° C. from room temperature.

Figure 7:
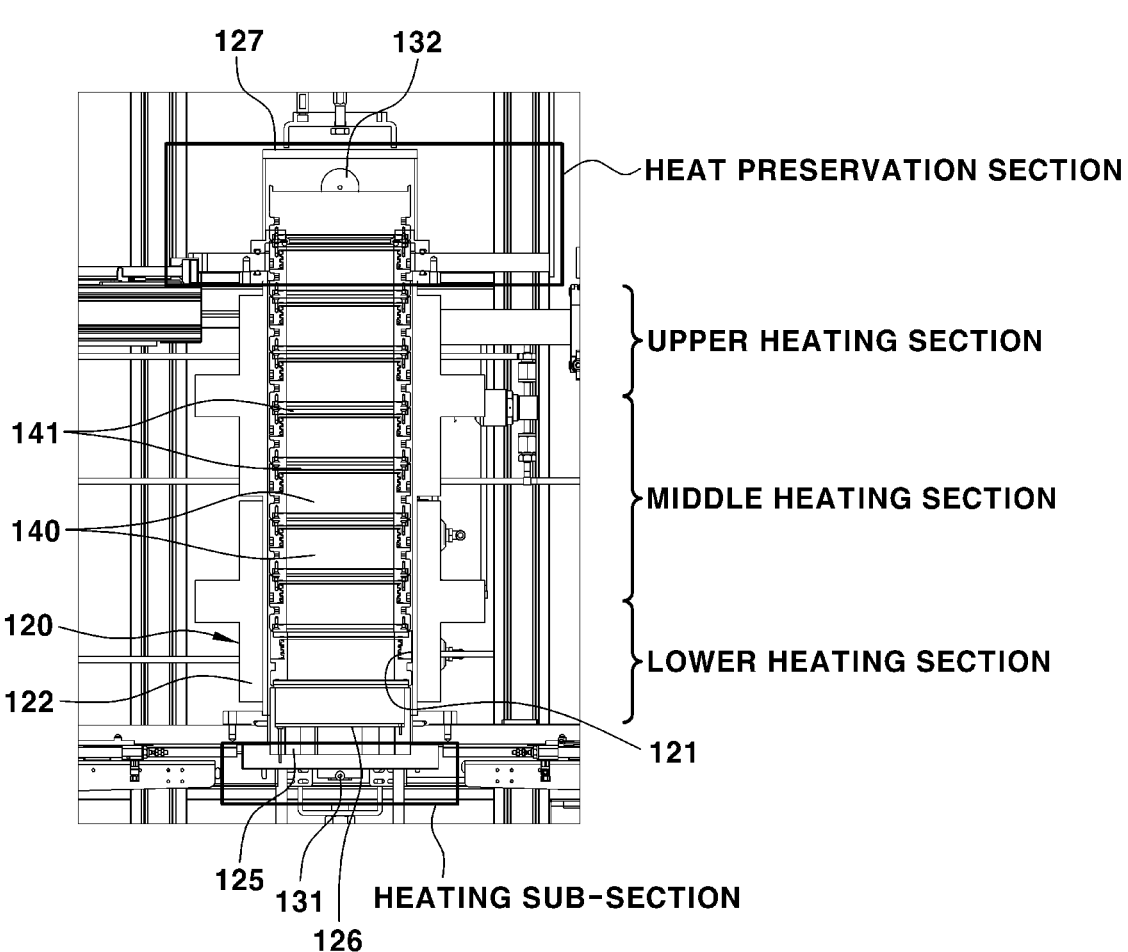
FIG. 7 is a view illustrating a practical example where a main process section and a cooling section of a main chamber are set differently in the powder-surface treatment apparatus according to an embodiment of the present disclosure.

FIG. 7 is a view illustrating a practical example where a main process section and a cooling section of the main chamber are set differently in the powder-surface treatment apparatus according to an embodiment of the present disclosure.

As illustrated, among all the sections of the main chamber 120, the heating section in which a heater that is the heating apparatus is installed may be partitioned into a plurality of sections. In this case, the heating section may be partitioned into four sections, that is, a heating sub-section, a lower heating section, a middle heating section, and an upper heating section, starting from the bottom of the main chamber 120.

Among the total of the four heating sections, the lower heating section, the middle heating section, and the upper heating section constitute a main heating section. In addition, unlike in the practical example of an embodiment of the present disclosure in FIG. 6, an upper portion of the heating section, that is, the upper portion of the main chamber 120 may be configured as a heat preservation section in which a heater is installed, instead of the cooling section.

A cartridge heater may be used as a sub-heater that is installed in the heating sub-section that is the lowermost portion of the main chamber 120. The heating sub-section serves to minimize heat loss in the main chamber 120 and thus increase the temperature of the main heating section and keep the main heating section at a uniform temperature.

A band-type ceramic heater may be mostly used as a main heater that is installed in the main heating section. The main heating section may be configured as at least three sections, depending on a length of the main chamber 120 and a process.

With this configuration, the temperature uniformity of the main chamber 120 may be secured, and, at the same time, a required temperature may be maintained. In the practical example in FIG. 7, the main heating section is made up of three sections, that is, the lower heating section, the middle heating section, and the upper heating section.

Of the main heating section, the lower heating section is a section in which a process is mainly performed, and the temperature thereof is set on the basis of the temperature inside a window during an ALD process. Subsequently to the process in the lower heating section, the temperature of the middle heating section is set in such a manner as that the process is continuously performed. The upper heating section is set to a minimum temperature for preventing heat loss of the middle heating section, leading to a decrease in the temperature of the sub-chamber 140.

In the heat preservation section that is the uppermost section, a rubber heater or a band heater may be used. The heat preservation section is only set to a minimum temperature for preventing adsorption of a ligand escaping to a pump when purging is performed after reaction.

In this manner, in a practical example of an embodiment of the present disclosure, the middle heating section varies from one process to another. Thus, a process section and a cooling section can be distinguished from each other. In this case, the cooling section is cooled to approximately 100° C. instead of being cooled to room temperature. The temperature of the cooling section does not mean up to room temperature, but means a temperature relatively lower than that of the main process section.

A state of operation of the powder-surface treatment apparatus according to an embodiment of the present disclosure and a powder-surface treatment process that is performed on the powder by the operation thereof will be described below.

In the powder-surface treatment process in a practical example of an embodiment of the present disclosure, the sub-chamber 140 filled with the powder is automatically loaded and unloaded.

As illustrated in FIG. 3, among the constituent elements of the surface treatment apparatus 100 according to an embodiment of the present disclosure, operation of each of the constituent elements, such as the loading apparatus 150, the unloading apparatus 160, the gas supply apparatus 191, the ventilation apparatus 192, the first cap moving mechanism 171, the second cap moving mechanism 174, the chamber fixation apparatus 180, and the temperature adjustment apparatuses 193, 194, and 195 may be controlled according to the control signal of the controller 103.

The powder that is a target for the surface treatment process in a practical example of an embodiment of the present disclosure, for example, may contain carbon (C). A starting material (source material) contained in raw gas may be a precursor, particularly, a metal precursor, and, more particularly, a platinum (Pt) precursor.

Purge gas may be inert gas, such nitrogen or argon. Reactant gas may be oxygen or ozone. During the surface treatment process, the raw gas, the purge gas, the reactant gas, and the purge gas may be supplied sequentially through the injection unit 131 in the main chamber 120. In addition, during the surface treatment process, the inside of the sub-chamber 140 is kept in a vacuum, and the inside of the sub-chamber 140 may be kept at a predetermined process temperature.

Gas that is supplied through the injection unit 131 provided in a lower end portion of the main chamber 120 passes through the lowermost sub-chamber 140 and then sequentially passes through the sub-chambers 140 above. Thereafter, when venting is performed, the gas passing through the uppermost sub-chamber 140 is discharged to the outside through the discharging unit 132 provided in an upper end portion of the main chamber 120.

Subsequently to the surface treatment process, among the plurality of sub-chambers 140 arranged to be stacked on top of each other in the multi-step configuration inside the accommodation space 121 in the main chamber 120, an unloading process of discharging the uppermost sub-chamber 140 from the accommodation space 121 in the main chamber 120 is performed.

A more detailed description is provided with reference to the drawings. FIGS. 8A to 8G are views each illustrating a state where the surface treatment apparatus 100 according to an embodiment of the present disclosure performs an unloading operation. FIGS. 8A to 8G illustrate in a stepwise manner the unloading process in which the uppermost sub-chamber 140 is discharged from the accommodation space 121 in the main chamber 120 to the outside after undergoing the surface treatment process.

Figure 8A:
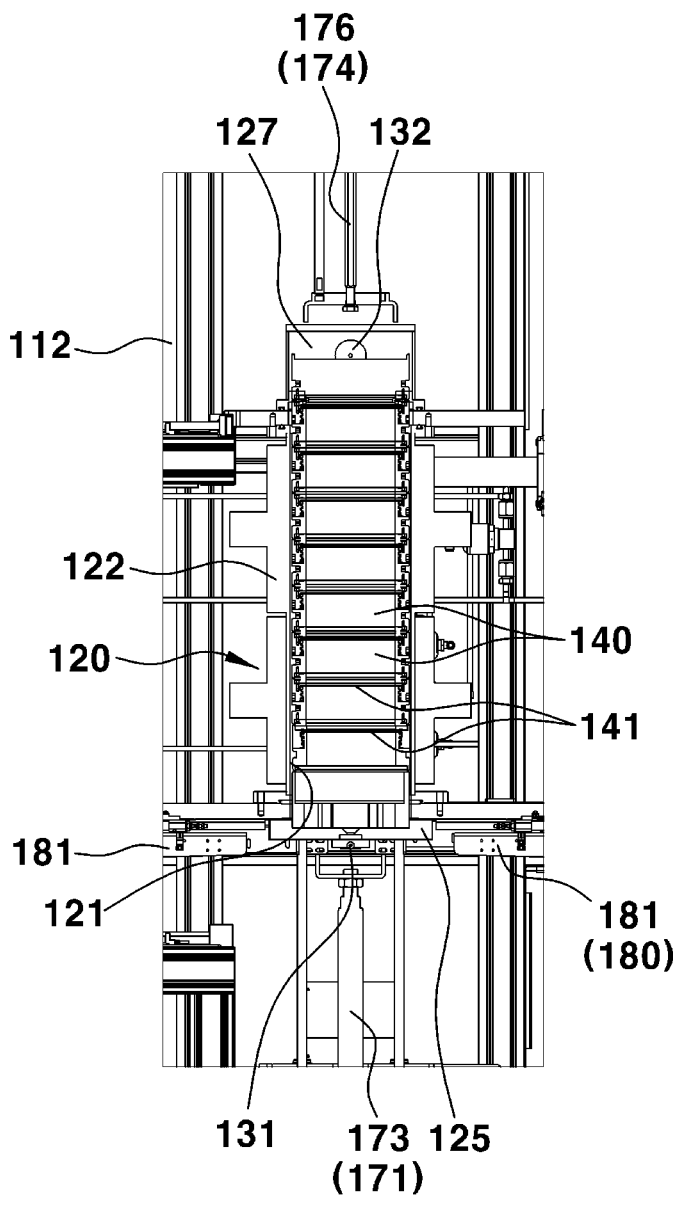

FIG. 8A illustrates a state wherein the uppermost sub-chamber 140 is on standby for being unloaded. When the surface treatment process is completed, the gas inside the main chamber 120 and the sub-chamber 140 is vented out by the ventilation apparatus 192 (in FIG. 3), and subsequently, the uppermost sub-chamber 140 is on standby before being unloaded.

As illustrated, in a state where the plurality of sub-chambers 140 are arranged to be stacked on top of each other in the multi-step configuration inside the accommodation space 121 in the main chamber 120, the uppermost sub-chamber 140 is positioned in the internal space in the second end cap 127 closing the second opening in the main chamber 120 (the chamber main body).

Figure 8B:
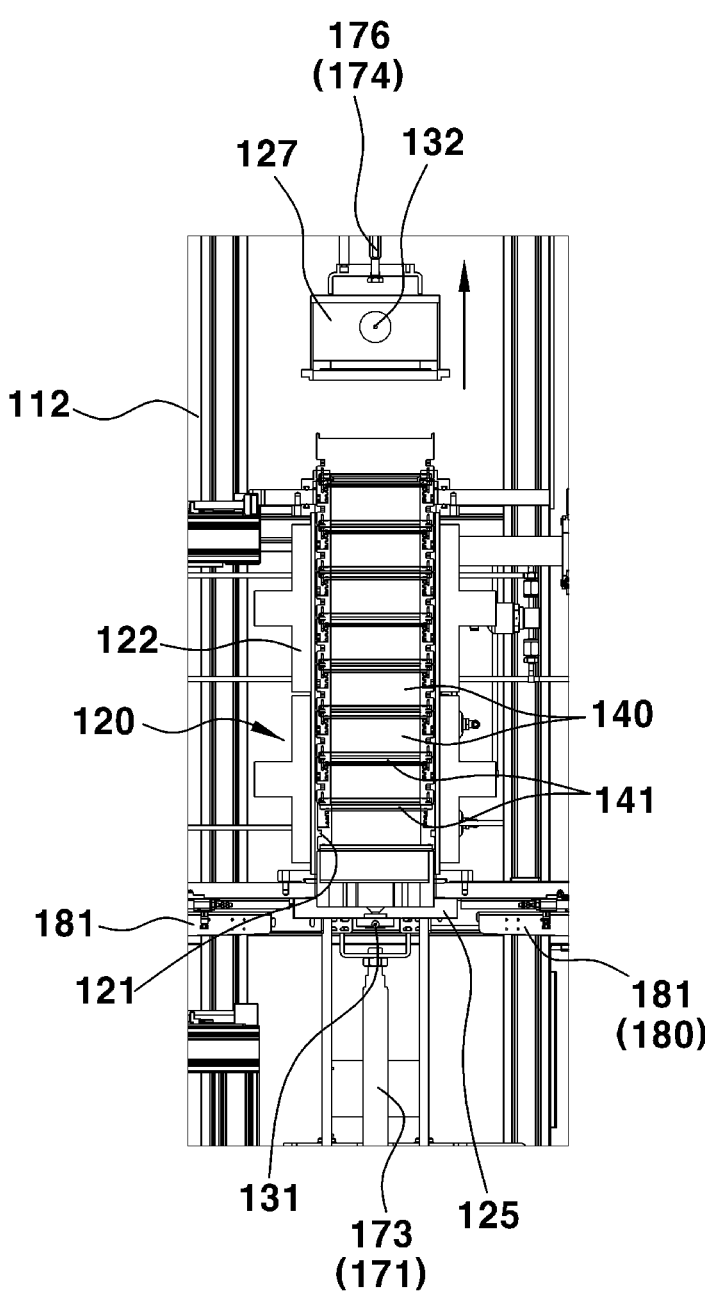

FIG. 8B illustrates a state where the second end cap 127 ascends by the second cap moving mechanism 174 inside the upper room 112 in the housing 110 (in FIG. 2) and is separated from the chamber main body 122 of the main chamber 120. When the second end cap 127 ascends and thus is separated, the second opening that is the upper-end opening in the chamber main body (a main body) 122 is open.

As illustrated, when the second end cap 127 ascends and is separated from the chamber main body 122 of the main chamber 120, among the plurality of sub-chambers 140 arranged to be stacked on top of each other in the multi-step configuration inside the accommodation space 121 in the main chamber 120, the entire uppermost sub-chamber 140 or a portion thereof is exposed to the upper room 112 out of the chamber main body 122 through the second opening.

Figure 8C:
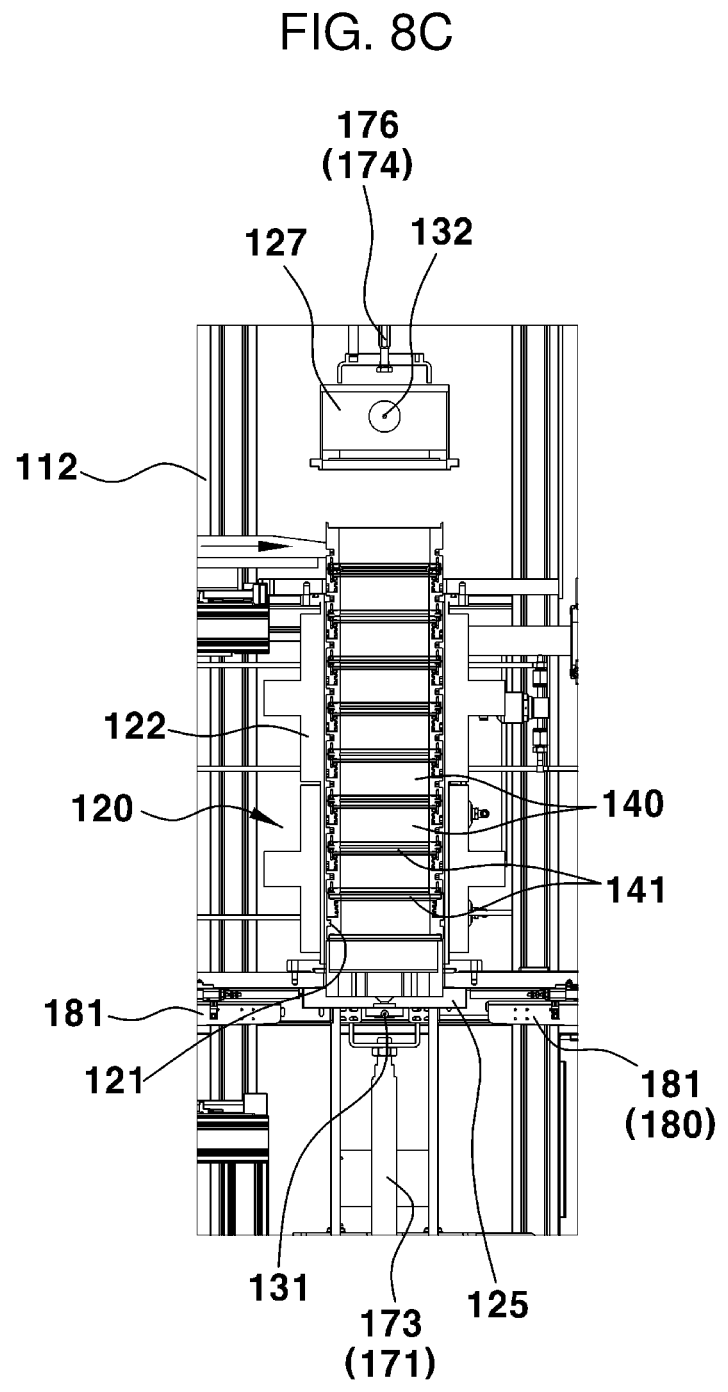

FIG. 8C illustrates a state where in the upper room 112, the gripping mechanism 162 of the unloading apparatus 160 is moved forward by the moving mechanism 164 (in FIG. 2) and grips the uppermost sub-chamber 140 exposed out of the chamber main body 122. In this manner, when the uppermost sub-chamber 140 is gripped by the gripping mechanism 162, a position of the uppermost sub-chamber 140 is fixed.

Figure 8D:
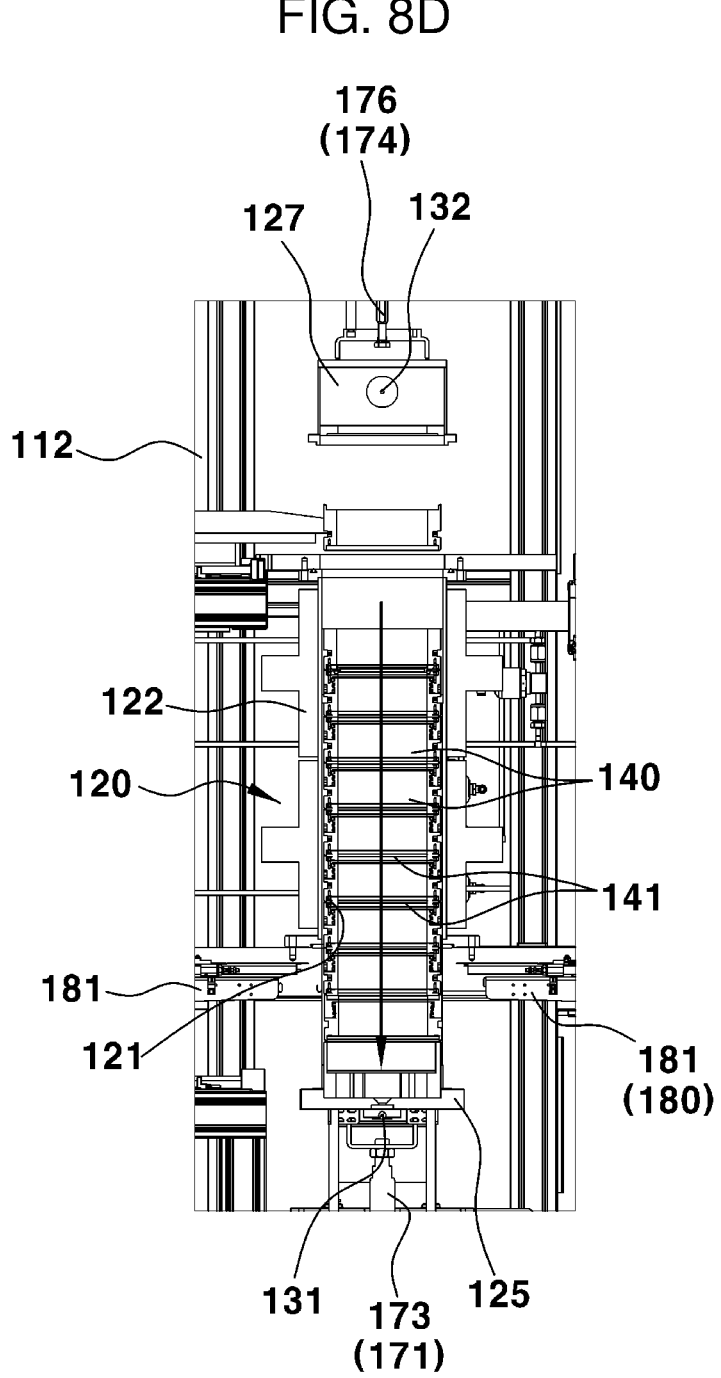

FIG. 8D illustrates a state where the second end cap 127 descends, with the uppermost sub-chamber 140 being fixed by the gripping mechanism 162. As illustrated, in a state where the uppermost sub-chamber 140 is fixed by the gripping mechanism 162, when the second cap moving mechanism 174 operates to cause the first end cap 125 to descend, the first end cap 125 is separated from the chamber main body 122 of the main chamber 120. Accordingly, the first opening that is the lower-end opening in the chamber main body 122 is open.

In addition, as illustrated, the sub-chambers 140 other than the uppermost sub-chamber 140 fixed by the gripping mechanism 162 descend, together with the first end cap 125. At this point, among the plurality of sub-chambers 140 arranged to be stacked on top of each other in the multi-step configuration inside the accommodation space 121 in the main chamber 120, the sub-chambers 140 other than the uppermost sub-chamber 140, that is, the sub-chambers 140 supported by the first end cap 125 and the first cap moving mechanism 171, all descend.

Figure 8E:
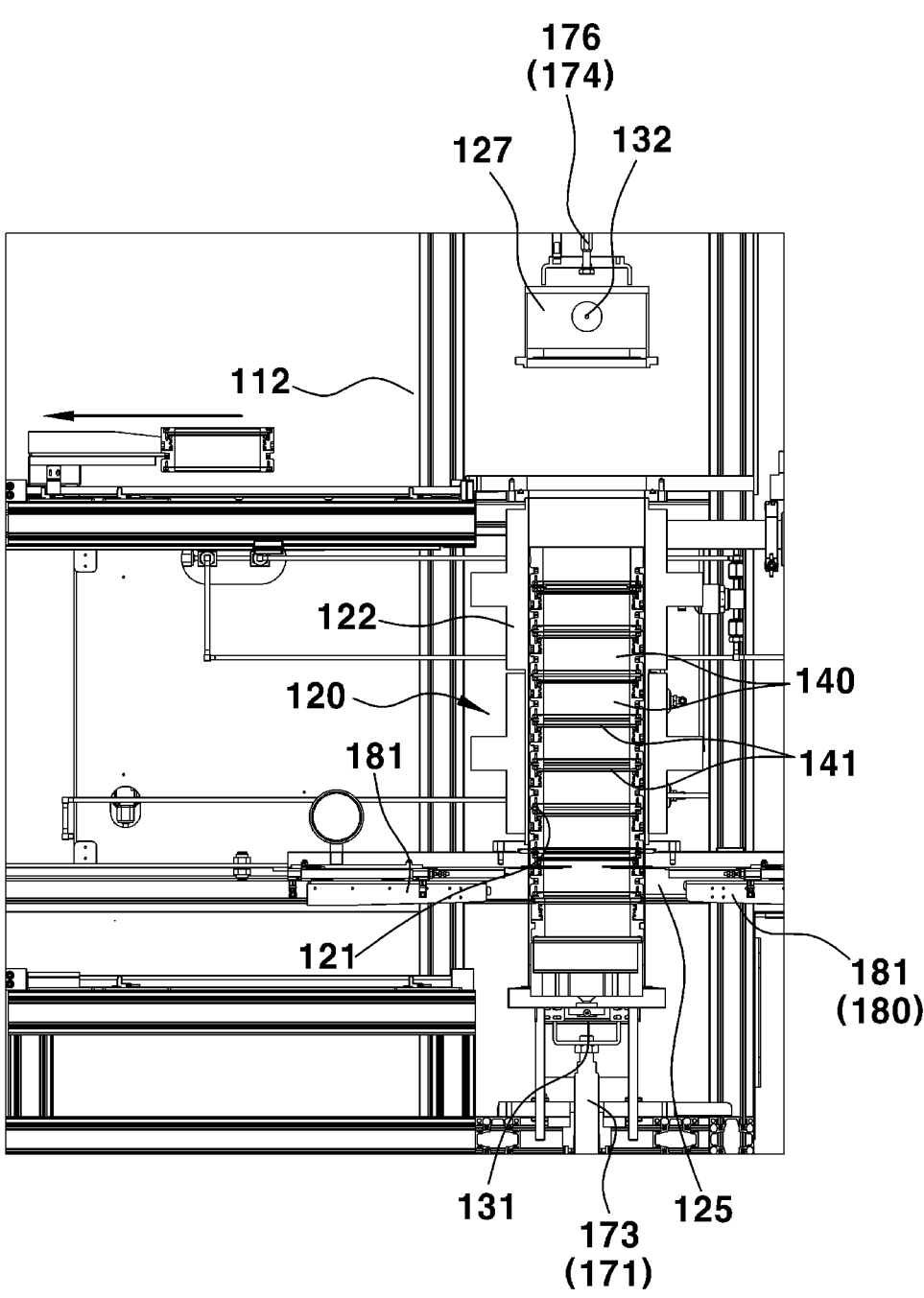

FIG. 8E illustrates a state where the gripping mechanism 162 of the unloading apparatus 160 is moved to the unloading position. In the upper room 112 in the housing 110 (in FIG. 2), the gripping mechanism 162 is moved backward by the moving mechanism 164, in a state of gripping the uppermost sub-chamber 140.

As illustrated, when the gripping mechanism 162 is moved backward to the unloading position by the moving mechanism 164, in the upper room 112 in the housing 110, the uppermost sub-chamber 140 is also moved to the unloading position, together with the gripping mechanism 162.

Figure 8F:
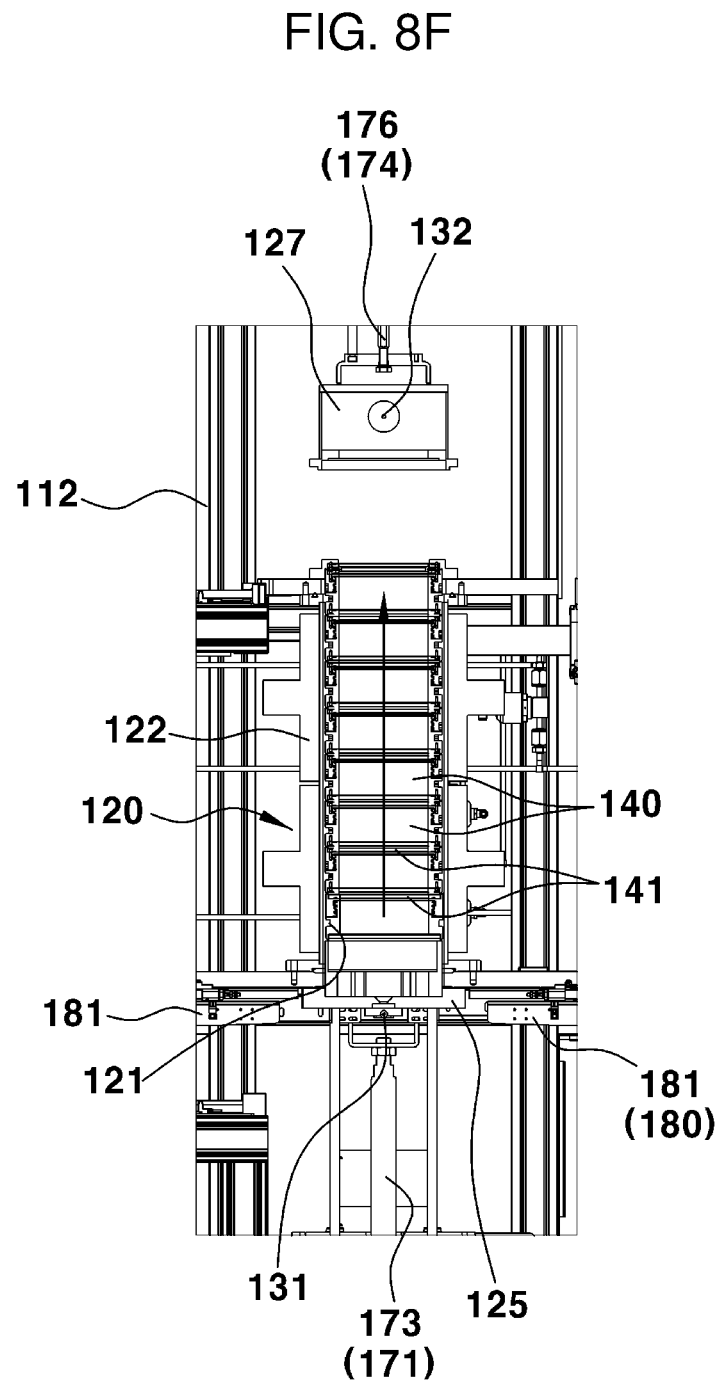

FIG. 8F illustrates a state where the ascending of the first end cap 125 by the first cap moving mechanism 171 while the uppermost sub-chamber 140 is unloaded closes the second opening that is the lower-end opening in the chamber main body 122.

As illustrated, when the first end cap 125 ascends, the sub-chambers 140 supported by the first end cap 125 ascend, together with the first end cap 125 inside the accommodation space 121 in the main chamber 120. Subsequently, the first end cap 125 closes the first opening that is the lower-end opening in the chamber main body 122 (the main chamber 120).

Figure 8G:
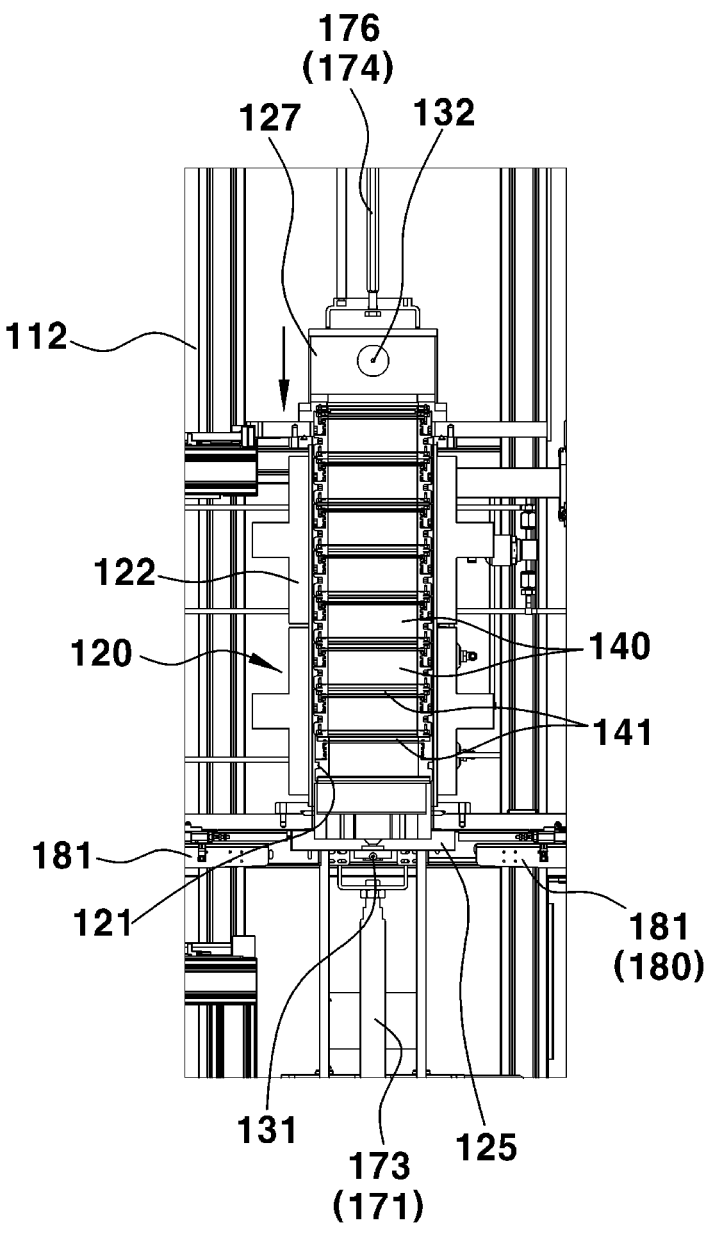

FIG. 8G illustrates a state where the second end cap 127 is combined with the chamber main body 122 of the main chamber 120 after descending by the second cap moving mechanism 174 inside the upper room 112 in the housing 110. When the second end cap 127 descends and is combined with the chamber main body 122, the second opening that is the upper-end opening in the chamber main body 122 (the main body) is re-closed.

Accordingly, the process of unloading the uppermost sub-chamber 140 is all completed.

The uppermost sub-chamber 140, as described above, is discharged to the outside from the accommodation space 121 in the main chamber 120 and is unloaded. Subsequently, the new sub-chamber 140 is loaded into the accommodation space 121 in the main chamber 120 and is inserted to undergo the surface treatment process.

As described above, after the surface treatment process, in the unloading process, the uppermost sub-chamber 140 inside the accommodation space 121 in the main chamber 120 is discharged to the outside, and in the loading process, the sub-chamber 140 that is newly inserted to undergo the surface treatment process is loaded into the lowermost region of the accommodation space 121 in the main chamber 120.

When the unloading operation is performed, after the second end cap 127 is open, the uppermost sub-chamber 140 inside the accommodation space 121 is discharged to the outside through the second opening that is the upper-end opening in the main chamber 120 (the chamber main body). When the loading operation is performed, after the first end cap 125 is open, the new sub-chamber 140 is introduced and loaded into the accommodation space 121 through the first opening that is the lower-end opening in the main chamber 120 (the chamber main body).

Therefore, after the surface treatment process, when the unloading process and the loading process are both performed, the existing uppermost sub-chamber 140 is in a state of being discharged to the outside. Therefore, the sub-chamber 140 that is positioned just below the existing uppermost sub-chamber 140 is moved to the uppermost region and is positioned therein.

In the same manner, the sub-chamber 140 in the third region from the top is moved to the second region and is positioned therein. Then, the sub-chamber 140 in the fourth region from the top is moved to the third region and is positioned therein. In addition, the existing lowermost sub-chamber 140 is moved to the second region from the bottom, and the sub-chamber 140 that is newly inserted and loaded is thereafter the lowermost sub-chamber 140.

When the unloading operation and the loading operation are both finished, the sub-chambers 140 inside the accommodation space 121 in the main chamber 120 are each moved upward by one step (by one region) and are positioned in respective regions that are one step higher. Then, in this state, the surface treatment process is re-performed.

A process of loading the new sub-chamber 140 will be described below.

FIGS. 9A to 9I are views each illustrating a state where the surface treatment apparatus 100 according to an embodiment of the present disclosure performs the loading operation. FIGS. 9A to 9I illustrate in a stepwise manner the loading process of inputting the new sub-chamber 140 into the accommodation space 121 in the main chamber 120.

Figure 9A:
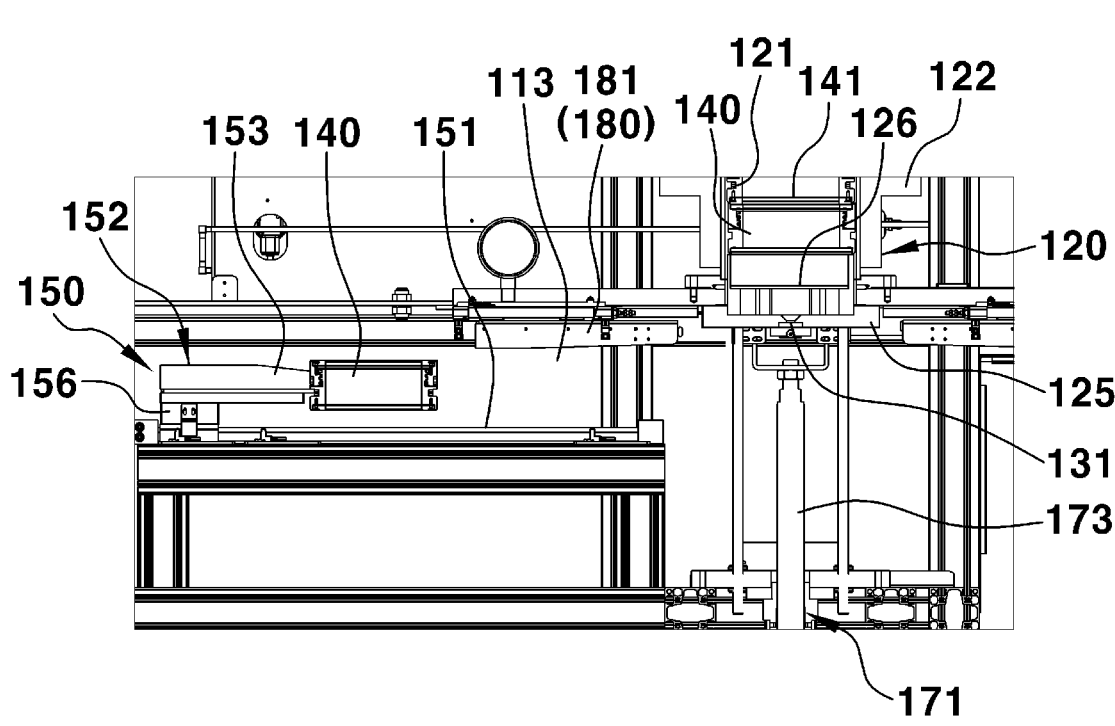

First, FIG. 9A illustrates a state where the new sub-chamber 140 is prepared for loading. The new sub-chamber 140 to be input in the prepared state is positioned in the lower room 114 in the housing 110 (in FIG. 2) in a state of being filled with the powder.

At this point, the new sub-chamber 140 is in a state of being fixed to the loading apparatus 150 and is gripped by the gripper 153 of the gripping mechanism 152, among the constituent elements of the loading apparatus 150. In addition, the lower room 114 in the housing 110 is kept at a predetermined temperature by the first temperature adjustment apparatus 193.

Accordingly, the sub-chamber 140 and the powder inside the sub-chamber 140 are in a state of being pre-heated. In addition, the lower room 114 is supplied with inert gas, such as nitrogen or argon, and is in a state of being filled with the inert gas. When the lower room 114 is pre-heated, the temperature of the lower room 113 is set to be in a temperature range in which the powder is not oxidized, and the waiting time in the preheated state is set to 30 minutes or more.

When, in this state, the sub-chamber 140 is completely prepared for loading, the inert gas, such as nitrogen or argon, is injected into the main chamber 120 through the injection unit 131 in such a manner that the accommodation space 121 in the main chamber 120 is no longer kept in a vacuum.

At this point, the first opening and the second opening in the main chamber 120 are both in a closed state, and when injection of the inert gas, as described, is completed, the internal space in the housing 110 including the lower room 114 and the like and the internal space (the accommodation space 121) in the main chamber 120 may be kept at the same pressure in such a manner that the first opening can be opened.

Figure 9B:
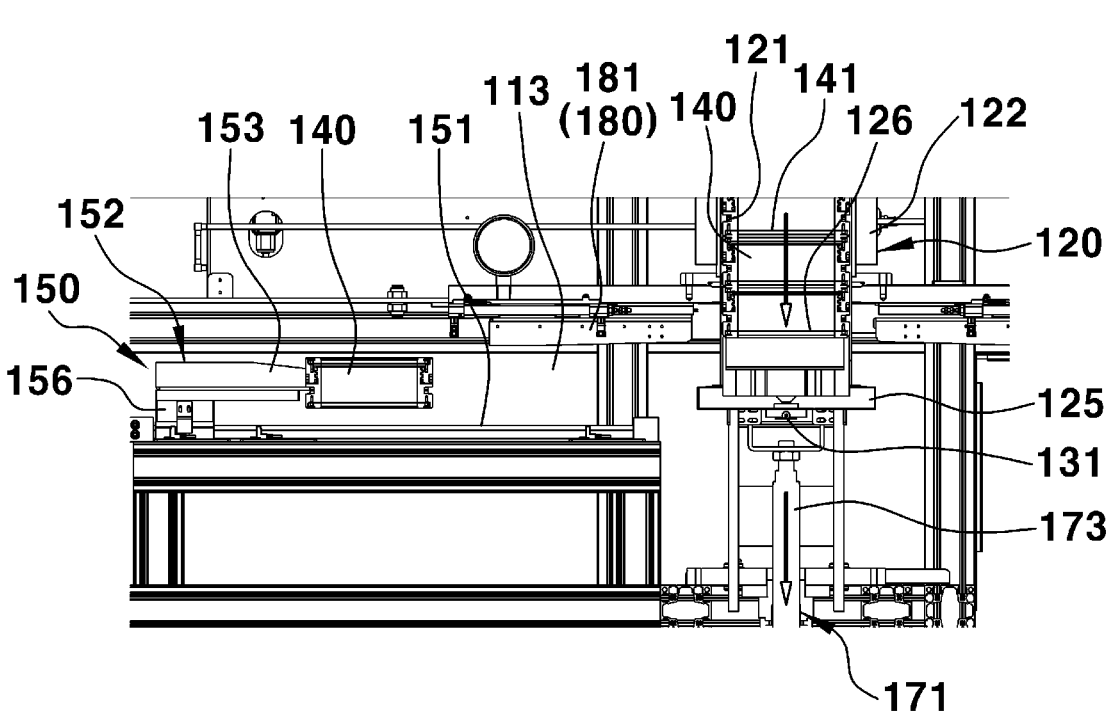

FIG. 9B illustrates a state where the first end cap 125 descends when the first cap moving mechanism 171 operates according to the control signal that is output by the controller 102 (in FIG. 3). The first end cap 125 descends to a predetermined height by the first cap moving mechanism 171 and is separated from the chamber main body 122 of the main chamber 120 in such a manner that the first opening in the main chamber 120 is open for loading the new sub-chamber 140.

At this point, the sub-chambers 140 inside the accommodation space 121 in the main chamber 120 descend at the same time in a state of being supported by the first end cap 125, together with the first end cap 125, to a height at which the lowermost sub-chamber 140 can be fixed by the chamber fixation apparatus 180.

Figure 9C:
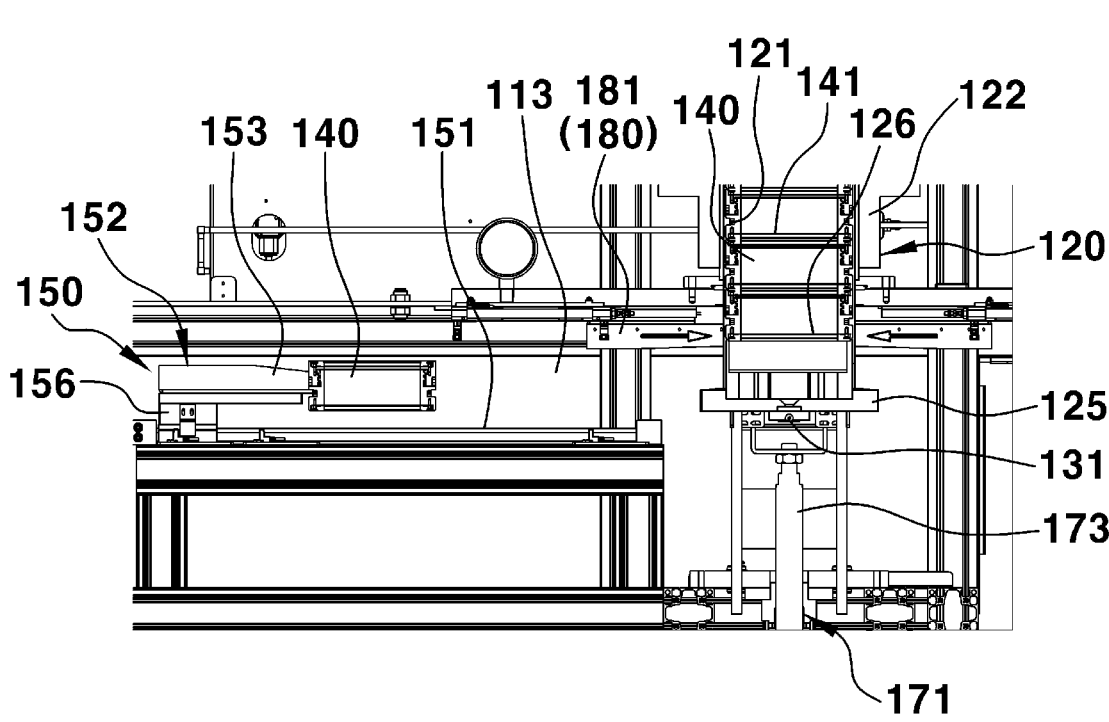

FIG. 9C illustrates a state where the lowermost sub-chamber 140 is fixed by the chamber fixation apparatus 180. The block driving mechanism of the chamber fixation apparatus 180 operates according to the control signal that is output by the controller 102 and moves forward a pair of left and right locking blocks 181. Accordingly, the two locking blocks 181 press against an outer circumferential surface of the lowermost sub-chamber 140 in such a manner as to come into contact therewith and thus fix the lowermost sub-chamber 140.

When the lowermost sub-chamber 140 is fixed in this manner, all the sub-chambers 140, including the lowermost sub-chamber 140, that are arranged to be stacked on top of each other in the multi-step configuration inside the accommodation space 121 in the main chamber 120 are kept fixed and thus do not fall.

Figure 9D:
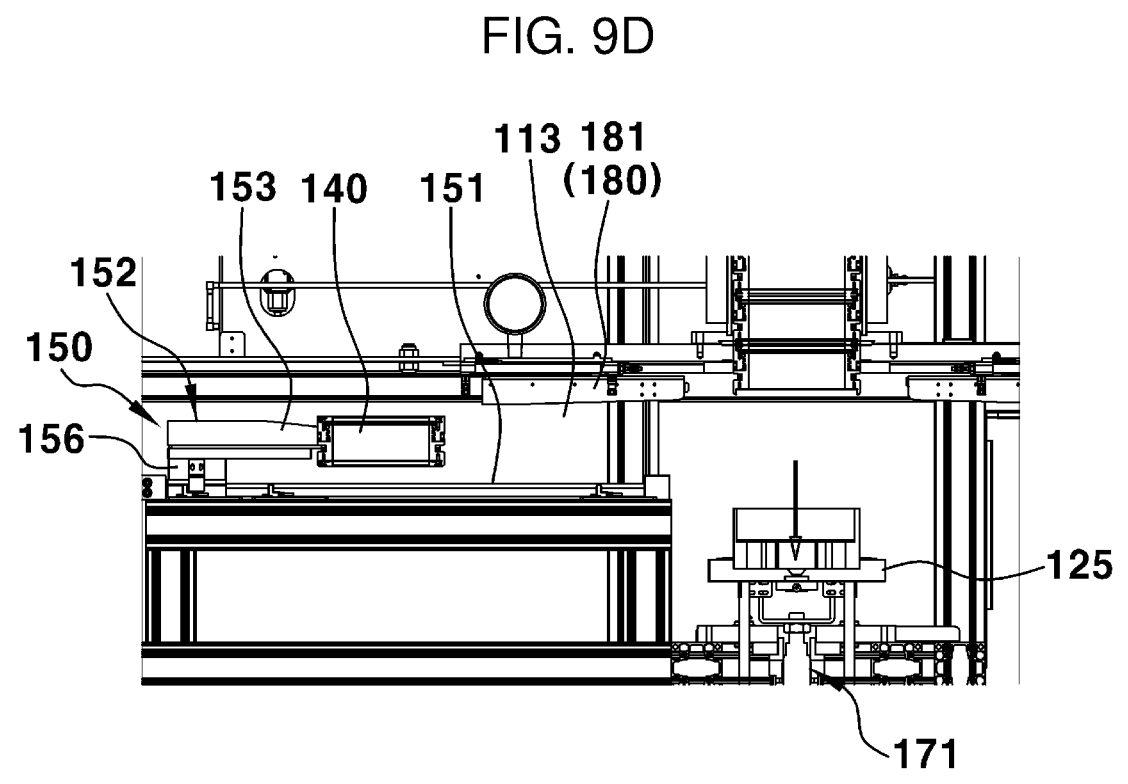

FIG. 9D illustrates a state where the first end cap 125 further descends, with the lowermost sub-chamber 140 being fixed by the chamber fixation apparatus 180, when the first cap moving mechanism 171 operates according to the control signal that is output by the controller 102.

Figure 9E:
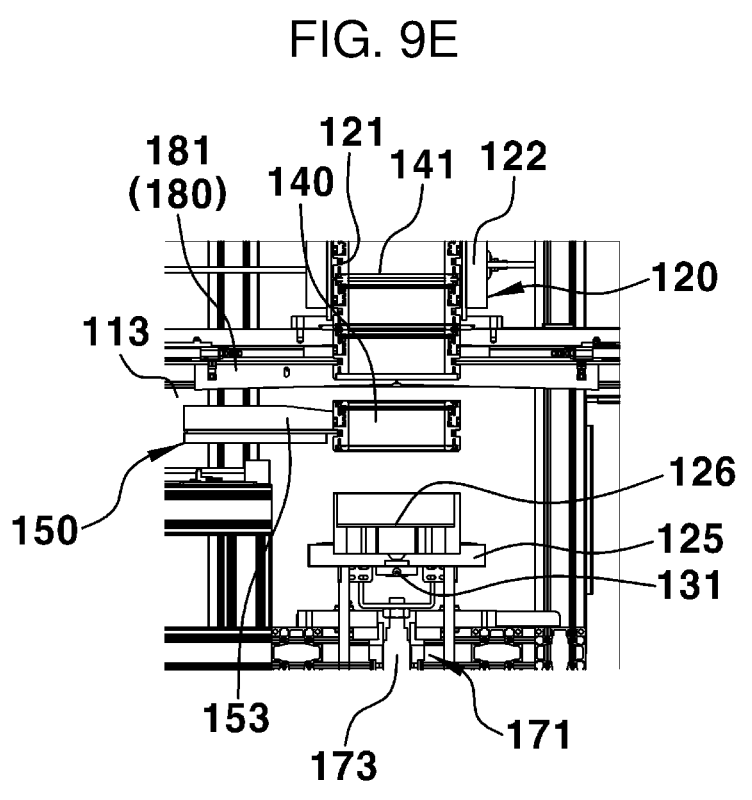

FIG. 9E illustrates a state where the gripper 153 gripping the new sub-chamber 140 is moved forward when the moving mechanism 154 of the loading apparatus 150 operates according to the control signal that is output by the controller 102 while the first end cap 125 is positioned at the lowest descending height. At this point, the new sub-chamber 140 to be inserted to undergo the surface treatment process is moved in such a manner as to be positioned over the first end cap 125.

Figure 9F:
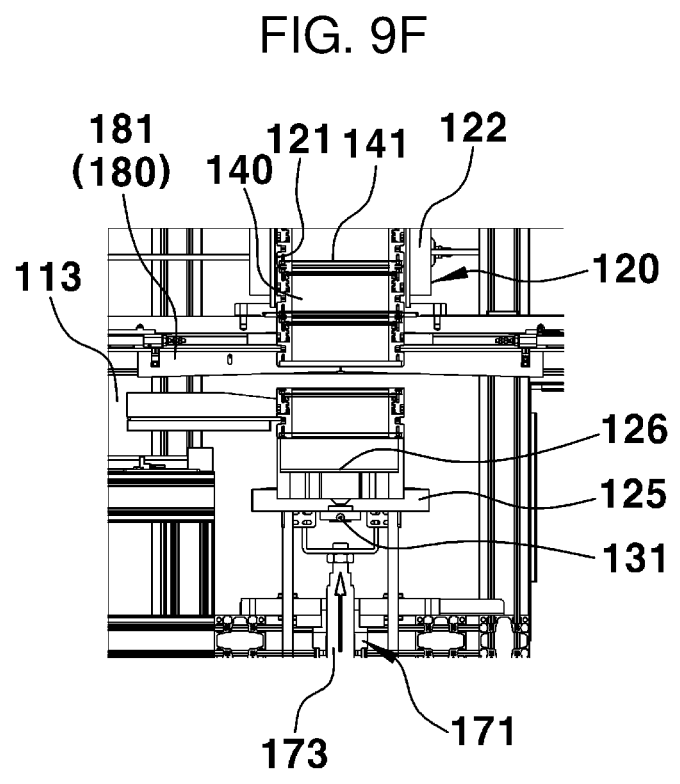

FIG. 9F illustrates a state where the first end cap 125 ascends when the first cap moving mechanism 171 operates according to the control signal that is output by the controller 102. At this point, the ascending first end cap 125 may support the sub-chamber 140 above in a state of being brought into contact with the sub-chamber 140 above.

Figure 9G:
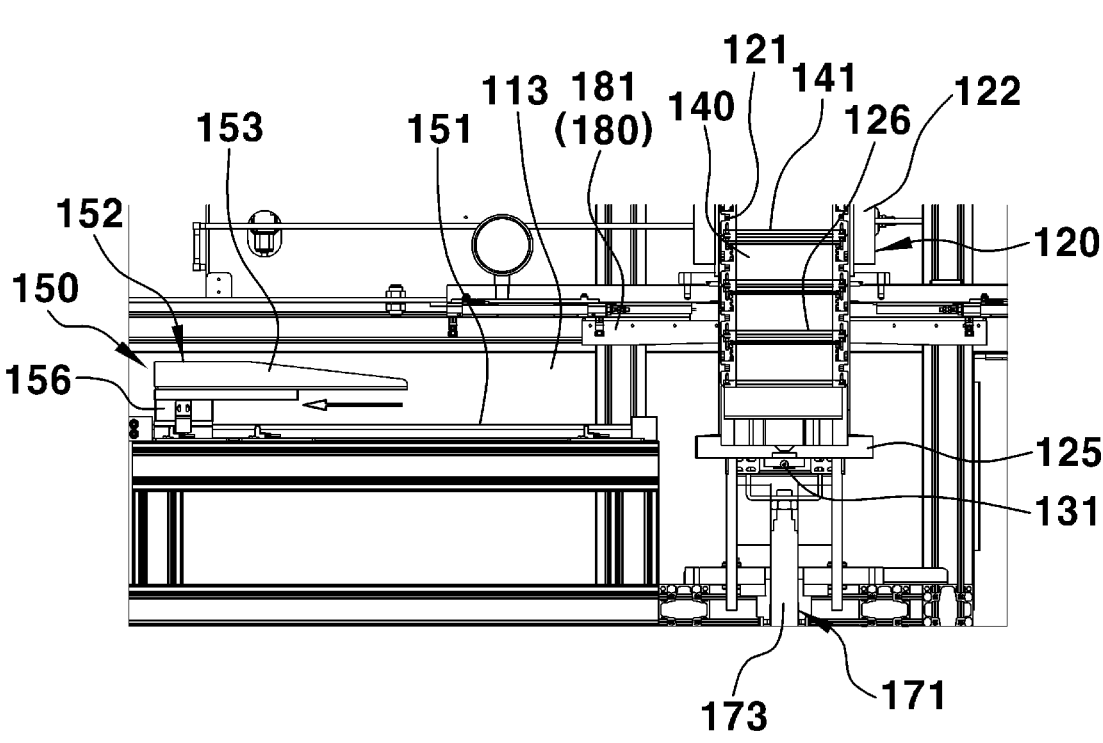

FIG. 9G illustrates a state where the first end cap 125 further ascends when the first cap moving mechanism 171 operates according to the control signal that is output by the controller 102. At this point, the first end cap 125 causes the sub-chamber 140 above to ascend in a state of supporting the sub-chamber 140 above and brings the sub-chamber 140 above into contact with the lowermost sub-chamber 140 fixed by the chamber fixation apparatus 180.

At this point, the first end cap 125, the new sub-chamber 140 above the first end cap 125, and the lowermost sub-chamber 140 above the new sub-chamber 140 are all in a state of being supported by the first end cap 125. While the first end cap 125 ascends, the moving mechanism 154 of the loading apparatus 150 operates according to the control signal that is output by the controller 102 and moves the gripper 153 backward back to the waiting position.

Figure 9H:
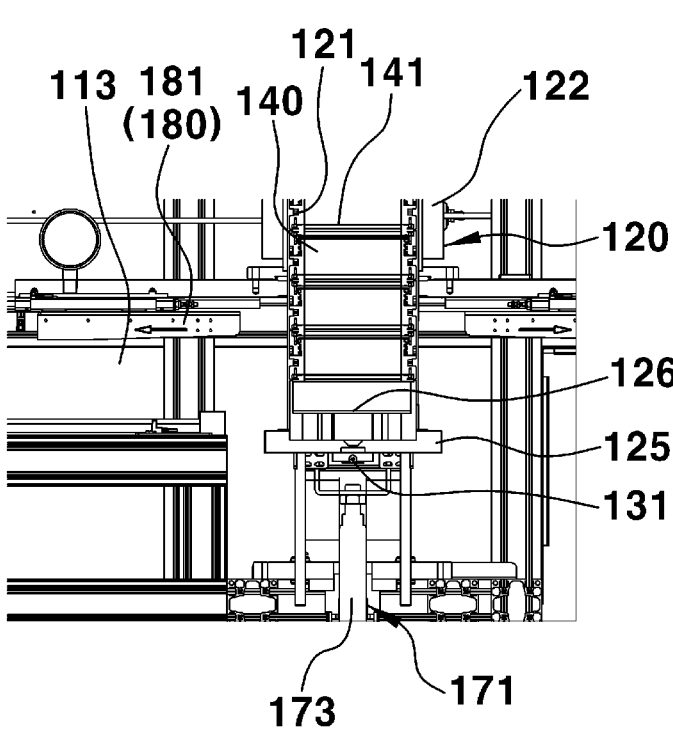

FIG. 9H illustrates a state where the sub-chamber 140 is no longer unfixed by the chamber fixation apparatus 180. FIG. 9H illustrates a state where the locking block 181 is moved backward back to the waiting position when the block driving mechanism of the chamber fixation apparatus 180 operates according to the control signal that is output by the controller 102.

In this state, the new sub-chamber 140 that is to be additionally inserted to undergo the surface treatment process is positioned under the previous lowermost sub-chamber 140. Subsequently, the sub-chamber 140 that is newly inserted is the lowermost sub-chamber 140.

In addition, FIG. 9H illustrates a state where the sub-chamber 140 is no longer fixed by the chamber fixation apparatus 180, that is, all the sub-chambers 140 inside the accommodation space 121 in the main chamber 120 are no longer fixed, and a state where all the sub-chambers 140 are supported by the first end cap 125.

Figure 9I:
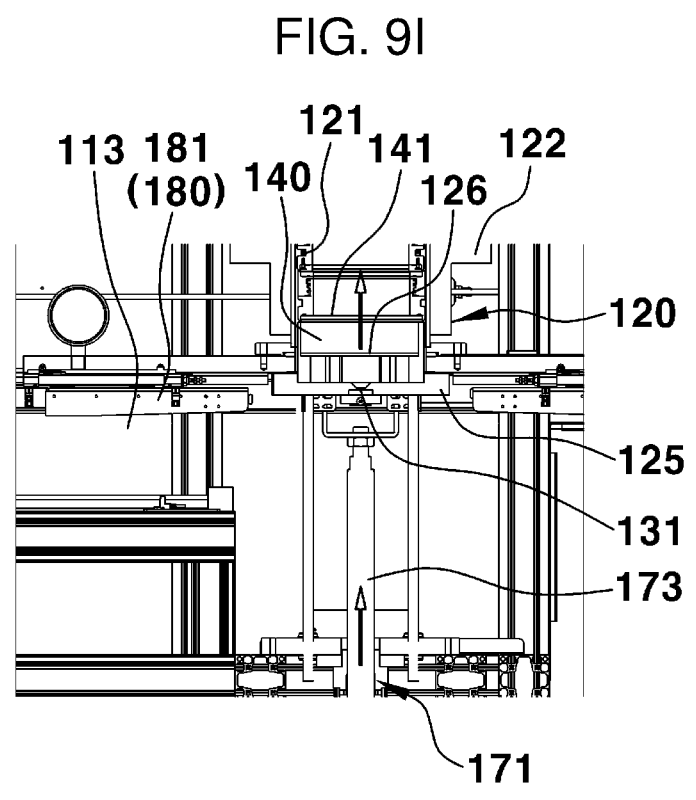

FIG. 9I illustrates a state where the new sub-chamber 140 is finally loaded. In the state in FIG. 9H, the first cap moving mechanism 171 operates according to the control signal that is output by the controller 102 and causes the first end cap 125 to further ascend.

At this point, the first end cap 125 closes the first opening in the main chamber 120 (the chamber main body), and the accommodation space 121 in the main chamber 120 returns to the sealed-up state. Consequently, the new sub-chamber 140 is in a state of being finally loaded into the accommodation space 121 in the main chamber 120.

The controller 102 causes the internal space in the main chamber 120 to return to a vacuum state from a pressurized state by operating a pump of the ventilation apparatus 192 (in FIG. 3) in such a manner that the surface treatment process is re-performed in the state in FIG. 9I.

A practical example and an experimental example of an embodiment of the present disclosure will be described in more detail below. The following practical example is for describing an embodiment of the present disclosure in an exemplary manner, and does not impose any limitation on the scope of the present disclosure.

Practical Example

Figure 10:
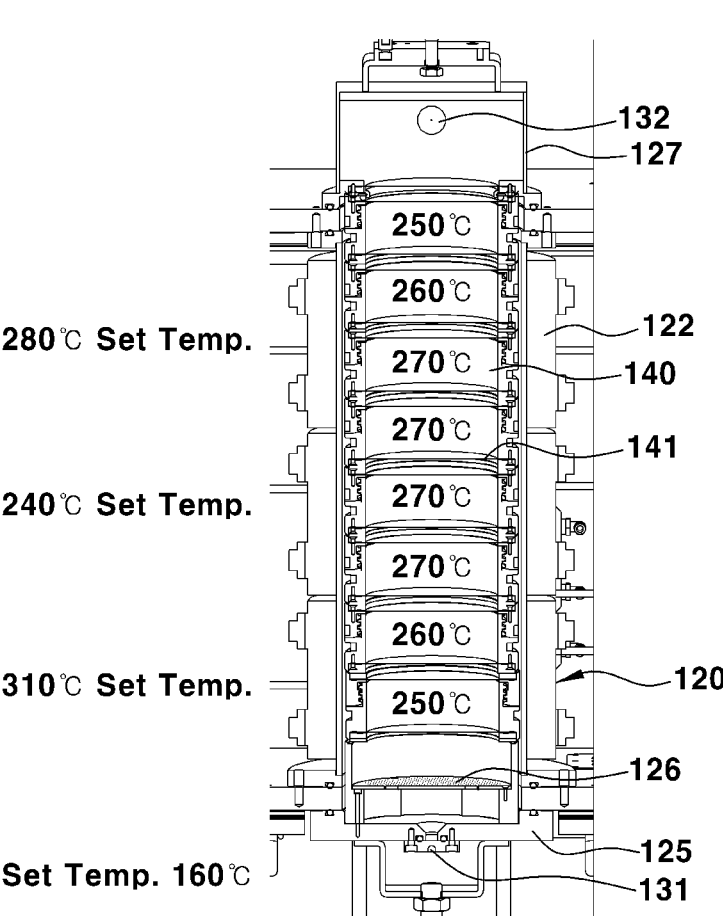
FIG. 10 is a view illustrating a process condition in an experimental example of an embodiment of the present disclosure.

FIG. 10 is a view illustrating a process condition in the experimental example of the present disclosure.

A catalyst for a polymer electrolyte membrane fuel cell (PEMFC) may be manufactured by depositing platinum nano-particles on carbon black.

With reference to FIG. 10, the main chamber 120 (a fluidized bed reactor (FBR)) is provided in such a manner that a total of eight sub-chambers 140 (a total of eight steps) are accommodated in the accommodation space 121 in a state of being vertically stacked on top of each other. The accommodation space 121 in the main chamber 120 was partitioned into first to eighth regions, starting from the injection unit 131 to the discharging unit 132. Accordingly, the sub-chamber 140 could be positioned in each region.

For deposition, carbon black with a diameter of 200 μm to 500 μm was selected, and 3 g of selected carbon black was loaded into each of the sub-chambers 140. At this point, the main chamber 120 and the sub-chamber 140 were kept in a vacuum in such a manner that they have an internal pressure of 1 torr.

In addition, a pre-heating temperature inside the lower room 114 in the housing 110 in which the loading operation was performed was set to 160° C., and thus a pre-heating environment was set up inside the lower room 114. Accordingly, the sub-chamber 140 to be inserted to undergo the surface treatment process and the powder inside the sub-chamber 140 were pre-heated in the lower room 114.

In addition, three heating sections were set up in the main chamber 120. Among the three heating sections, the temperature of the lower heating section was set to 310° C., the temperature of the middle heating section was set to 240° C., and the temperature of the upper heating section was set to 280° C. After the temperature of each of the heating sections was set in this manner, the second temperature adjustment apparatus 194 was operated. The actual temperature of each of the heating sections, which was adjusted by the second temperature adjustment apparatus, is shown in FIG. 10.

An inlet port of a canister containing a platinum precursor was opened, and the platinum precursor was inserted into the main chamber 120 and the sub-chamber 140. At this point, the platinum precursor gas was injected through the injection unit 131 in the lower end portion of the main chamber 120, and the entire platinum precursor was involved in reaction. Methyl-cyclopentadienyl tri-methyl platinum was used as the platinum precursor.

In addition, $O_2$ was used as a reactant gas, and purging was performed using an inert gas (nitrogen) that was a purge gas. Thus, a non-reactant material was removed. At this point, an injection speed of the reactant gas was set to 200 sccm, and an injection speed of the purge gas was set to 1000 sccm. "Platinum precursor gas (600 seconds)—purge gas (180 seconds)—reactant gas (180 seconds)—purge gas (180 seconds)" was set as one cycle process. 20 cycle processes were performed as a surface treatment process (an ALD process). In addition, when the unloading operation was performed in the upper room 112 in the housing 110, the temperature of the upper room 112 was set to 100° C. or below, and thus the powder undergoing the reaction was gradually cooled before being exposed to room temperature.

Figure 11:
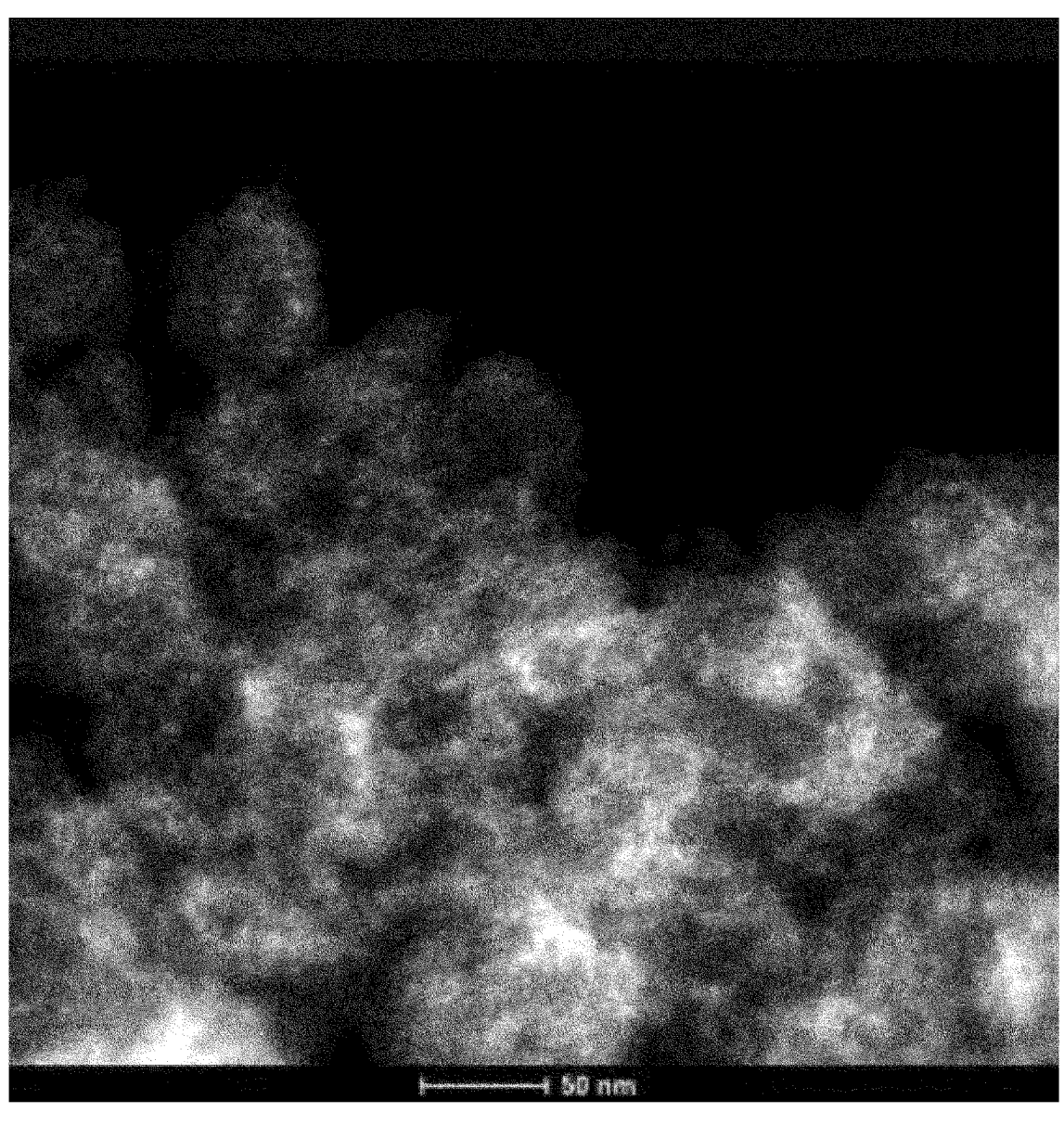
FIG. 11 is an image of a result in the experimental example of the embodiment of the present disclosure, captured by a scanning transmission electron microscope (STEM).

FIG. 11 is an image of the carbon black powder, captured by a scanning transmission electron microscope (STEM), on which the platinum nano-particles were deposited using the powder-surface treatment apparatus 100 according to an embodiment of the present disclosure. It can be seen that the platinum nano-particles were uniformly deposited on a surface of the carbon black without being clumped together (an amount of deposited platinum: 15.25 wt %).

The embodiments of the present disclosure are described in detail above, but impose no limitation on the claimed scope of the present disclosure. Various modifications and improvements that a person of ordinary skill in the art makes using the fundamental concept of the present disclosure that is defined in the following claims are also included in the claimed scope of the present disclosure.

What is claimed is:

1. A powder-surface treatment apparatus comprising:

a housing defining an internal space having a portion that may be sealed-up, wherein the housing comprises an upper room and a lower room that are sealable in a state where internal spaces of the upper room and lower room are each filled with inert gas;

a main chamber installed in the internal space in the housing and defining an accommodation space in which a surface treatment process is performable using atomic layer deposition;

an injection unit provided on a first end portion of the main chamber in such a manner that gas may be injected into the accommodation space in the main chamber through the injection unit;

a plurality of sub-chambers arranged in a stack on top of each other in a multi-step configuration along the accommodation space in the main chamber in a state where an internal space in each of the plurality of sub-chambers is filled with a powder, wherein the plurality of sub-chambers is configured in such a manner that the gas injected in the accommodation space in the main chamber may pass through the plurality of sub-chambers;

a discharging unit provided on a second end portion of the main chamber in such a manner that the gas passing through the plurality of sub-chambers may be discharged from the accommodation space in the main chamber through the discharging unit;

a loading apparatus configured to load a new sub-chamber into the accommodation space in the main chamber, in the sealed-up internal space in the housing that is filled with the inert gas, wherein the loading apparatus and a lower-end opening in the main chamber are positioned in the internal space in the lower room; and an unloading apparatus configured to unload at least one of the plurality of sub-chambers arranged to be stacked on top of each other in the accommodation space in the main chamber, from the accommodation space, and to discharge the at least one unloaded sub-chamber to the outside, wherein the unloading apparatus and an upper-end opening in the main chamber are positioned in the internal space in the upper room.

2. The apparatus of claim 1, wherein a lower portion of each of the plurality of sub-chambers or an upper portion thereof and the lower portion thereof have a mesh structure such that the gas injected in the accommodation space in the main chamber through the injection unit sequentially passes through internal spaces in the plurality of sub-chambers arranged to be stacked on top of each other in the multi-step configuration.

3. The apparatus of claim 1, wherein the sealed-up internal space in the housing is filled with inert gas while the loading apparatus and the unloading apparatus perform a loading operation and an unloading operation, respectively.

4. The apparatus of claim 1, wherein the loading apparatus comprises:

a bed installed in the internal space in the housing;

a gripping mechanism mounted so as to be movable along a path that is set to be on the bed and configured to move the new sub-chamber to a predetermined loading position, in a state of fixedly holding the new sub-chamber; and a moving mechanism configured to move the gripping mechanism along the path that is set to be on the bed.

5. The apparatus of claim 1, wherein the unloading apparatus comprises:

a bed installed in the internal space in the housing;

a gripping mechanism mounted so as to be movable along a path that is set to be on the bed and configured to move the sub-chamber undergoing a surface treatment process to outside of the accommodation space, in a state of fixedly holding the sub-chamber; and a moving mechanism configured to move the gripping mechanism along the path that is set to be on the bed.

6. A powder-surface treatment apparatus, the apparatus comprising:

a housing defining an internal space having a portion that may be sealed-up, wherein the housing comprises an upper room and a lower room that are sealable in a state where internal spaces of the upper room and lower room are each filled with inert gas;

a main chamber installed in the internal space in the housing and defining an accommodation space in which a surface treatment process is performable using atomic layer deposition, wherein the accommodation space in the main chamber extends in an upward-downward direction;

an injection unit provided on a first end portion of the main chamber in such a manner that gas may be injected into the accommodation space in the main chamber through the injection unit;

a plurality of sub-chambers arranged in a stack on top of each other in a multi-step configuration along the accommodation space in the main chamber in a state where an internal space in each of the plurality of sub-chambers is filled with a powder, wherein the plurality of sub-chambers is configured in such a manner that the gas injected in the accommodation space in the main chamber may pass through the plurality of sub-chambers;

a discharging unit provided on a second end portion of the main chamber in such a manner that the gas passing through the plurality of sub-chambers may be discharged from the accommodation space in the main chamber through the discharging unit;

a loading apparatus configured to load a new sub-chamber into the accommodation space in the main chamber, in the sealed-up internal space in the housing that is filled with the inert gas, wherein the new sub-chamber loaded by the loading apparatus is inserted into the accommodation space through a first opening that is a lower-end opening of the main chamber and wherein the loading apparatus and the first opening in the main chamber are positioned in the internal space in the lower room; and an unloading apparatus configured to unload at least one of the plurality of sub-chambers arranged to be stacked on top of each other in the accommodation space in the main chamber, from the accommodation space, and to discharge the at least one unloaded sub-chamber to the outside, wherein the sub-chamber undergoing the surface treatment process is discharged and unloaded, by the unloading apparatus, through a second opening that is an upper-end opening in the main chamber and wherein the unloading apparatus and the second opening in the main chamber are positioned in the internal space in the upper room.

7. The apparatus of claim 6, wherein a temperature adjustment apparatus is configured to adjust a temperature of each portion of the main chamber based on each of predetermined sections along the accommodation space installed in the main chamber.

8. The apparatus of claim 7, wherein the temperature adjustment apparatus comprises:
a cooling apparatus configured to cool an upper section, among the predetermined sections, in the main chamber; and
a heating apparatus configured to heat a lower section other than the upper section, among the predetermined sections, in the main chamber.

9. The apparatus of claim 6, wherein a temperature adjustment apparatus configured to pre-heat a pre-loading sub-chamber combined with the loading apparatus is provided in the lower room.

10. The apparatus of claim 6, wherein a temperature adjustment apparatus configured to cool a post-unloading sub-chamber combined with the unloading apparatus is provided in the upper room.

11. The apparatus of claim 6, wherein each time the sub-chamber undergoing the surface treatment process is unloaded and the new sub-chamber is loaded, the sub-chambers arranged to be stacked on top of each other inside the accommodation space in the main chamber are moved by one step from the first opening toward the second opening.

12. The apparatus of claim 6, wherein the main chamber comprises:
a chamber main body in which the accommodation space is defined and having the first opening that is the lower-end opening and the second opening that is the upper-end opening;
a first end cap configured to open and close the first opening in the chamber main body;
a second end cap configured to open and close the second opening in the chamber main body; and
cap moving mechanisms configured to open and close the first end cap and the second end cap, respectively.

13. The apparatus of claim 12, wherein the cap moving mechanisms comprise:
a first cap moving mechanism configured to move the first end cap upward and downward to open and close the first opening in the chamber main body; and
a second cap moving mechanism configured to move the second end cap upward and downward to open and close the second opening in the chamber main body.

14. The apparatus of claim 13, wherein:
the first cap moving mechanism and the second cap moving mechanism are cylinder mechanisms, each having a piston rod configured to move forward and backward in an upward-downward direction in a cylinder main body;
the first end cap is integrally mounted on the piston rod of the cylinder mechanism that is the first cap moving mechanism; and the second end cap is integrally mounted on the piston rod of the cylinder mechanism that is the second cap moving mechanism.

15. The apparatus of claim 12, wherein:
in a state where the first opening in the chamber main body is opened by descending of the first end cap by the respective cap moving mechanism, the loading apparatus is configured to load the new sub-chamber to be inserted to a position over the first end cap; and
when the first end cap ascends and closes the first opening in the chamber main body, the new sub-chamber loaded to the position over the first end cap is moved into the accommodation space in the chamber main body in a state of being supported by the first end cap.

16. The apparatus of claim 12, wherein:
when the first end cap is combined with a lower end portion of the chamber main body and closes the first opening, the plurality of sub-chambers arranged to be stacked on top of each other in the multi-step configuration along the accommodation space in the main chamber is supported by the first end cap; and
when the first end cap is separated from the chamber main body and descends to open the first opening, the plurality of sub-chambers descend along the accommodation space in the main chamber in a state of being supported by the first end cap.

17. The apparatus of claim 16, further comprising a chamber fixation apparatus installed in the housing, wherein the chamber fixation apparatus is configured to selectively fix or unfix a lowermost sub-chamber, among the plurality of sub-chambers that descend together with the first end cap in a state of being arranged to be stacked on top of each other in the multi-step configuration along the accommodation space in the main chamber, in a state where the first end cap descends to a predetermined height after being separated from the chamber main body.

18. The apparatus of claim 17, wherein the chamber fixation apparatus comprises:
a pair of locking blocks combined with a guide unit installed in the housing to be movable forward and backward; and
a block driving mechanism configured to move the pair of locking blocks forward and backward, wherein the pair of locking blocks press against and thus fix the lowermost sub-chamber, in a state of being moved forward by the block driving mechanism.

19. The apparatus of claim 12, wherein:
in a state where the second end cap closes the second opening in the chamber main body, among the plurality of sub-chambers arranged to be stacked on top of each other in the multi-step configuration along the accommodation space in the main chamber, an uppermost sub-chamber is positioned in an internal space in the second end cap; and
in a state where ascension of the second end cap opens the second opening in the chamber main body, the unloading apparatus is configured to unload the uppermost sub-chamber exposed outside of the chamber main body through the second opening.

20. A powder-surface treatment apparatus, the apparatus comprising:
a housing defining an internal space having a portion that may be sealed-up;
a main chamber installed in the internal space in the housing and defining an accommodation space in which a surface treatment process is performable using atomic layer deposition, wherein the accommodation space in the main chamber extends in an upward-downward direction;

an injection unit provided on a first end portion of the main chamber in such a manner that gas may be injected into the accommodation space in the main chamber through the injection unit;

a plurality of sub-chambers arranged in a stack on top of each other in a multi-step configuration along the accommodation space in the main chamber in a state where an internal space in each of the plurality of sub-chambers is filled with a powder, wherein the plurality of sub-chambers is configured in such a manner that the gas injected in the accommodation space in the main chamber may pass through the plurality of sub-chambers;

a discharging unit provided on a second end portion of the main chamber in such a manner that the gas passing through the plurality of sub-chambers may be discharged from the accommodation space in the main chamber through the discharging unit;

a loading apparatus configured to load a new sub-chamber into the accommodation space in the main chamber, in the sealed-up internal space in the housing that is filled with inert gas, wherein the new sub-chamber loaded by the loading apparatus is inserted into the accommodation space through a first opening that is a lower-end opening of the main chamber; and an unloading apparatus configured to unload at least one of the plurality of sub-chambers arranged to be stacked on top of each other in the accommodation space in the main chamber, from the accommodation space, and to discharge the at least one unloaded sub-chamber to the outside, wherein the sub-chamber undergoing the surface treatment process is discharged and unloaded, by the unloading apparatus, through a second opening that is an upper-end opening in the main chamber;

wherein the main chamber comprises a chamber main body in which the accommodation space is defined and having the first opening that is the lower-end opening and the second opening that is the upper-end opening, a first end cap configured to open and close the first opening in the chamber main body, a second end cap configured to open and close the second opening in the chamber main body, and cap moving mechanisms configured to open and close the first end cap and the second end cap, respectively;

wherein, in a state where the second end cap closes the second opening in the chamber main body, among the plurality of sub-chambers arranged to be stacked on top of each other in the multi-step configuration along the accommodation space in the main chamber, an uppermost sub-chamber is positioned in an internal space in the second end cap; and in a state where ascension of the second end cap opens the second opening in the chamber main body, the unloading apparatus is configured to unload the uppermost sub-chamber exposed outside of the chamber main body through the second opening.

* * * * *